United States Patent [19]
Hara et al.

[11] Patent Number: 5,694,495
[45] Date of Patent: Dec. 2, 1997

[54] IMAGE SENSING DEVICE AND IMAGE SENSING METHOD

[75] Inventors: Kunihiko Hara; Yasunari Miyake; Eiichi Funatsu; Yoshikazu Nitta, all of Amagasaki, Japan

[73] Assignee: Mitsubishi Denki Kabushiki Kaisha, Tokyo, Japan

[21] Appl. No.: 554,997

[22] Filed: Nov. 13, 1995

[30] Foreign Application Priority Data

Apr. 20, 1995 [JP] Japan ................... 7-095223

[51] Int. Cl.$^6$ ................ G06K 9/20; G06K 9/28
[52] U.S. Cl. ................ 382/324; 382/211; 348/308
[58] Field of Search ................ 382/312, 313, 382/314, 316, 317, 318, 319, 325, 321, 322, 323, 324, 201, 211, 217, 218, 219, 220, 221, 222, 223; 313/531, 537, 523; 338/15, 17; 250/208.1, 206.1, 206.2, 206.3; 348/294, 300, 302, 307, 308

[56] References Cited

U.S. PATENT DOCUMENTS

| | | | |
|---|---|---|---|
| 3,852,714 | 12/1974 | Carson | 382/324 |
| 4,786,818 | 11/1988 | Camp, Jr. | 348/308 |
| 5,086,483 | 2/1992 | Capps | 382/211 |
| 5,262,632 | 11/1993 | Mead et al. | 348/308 |

FOREIGN PATENT DOCUMENTS

| | | | |
|---|---|---|---|
| 62-184304 | 8/1987 | Japan | G01B 11/00 |
| 63-293427 | 11/1988 | Japan | G01J 1/42 |

OTHER PUBLICATIONS

"Digital Image Processing," by Masao Saito, Tokai Daigaku Shuppankai 1986.

*Image Input Technique Handbook*, by Yuuji Kiuchi, Nikkan Kogyo Shinbunsha 1992, pp. 84–85.

"Prototype of Document Recognition System with ImPP Chips," by Masaaki Mizuno et al., *Spring National Convention Record, The Institute of Electronics, Information and Communication Engineers*, 1991.

"Optical Neuro–Devices," by Kazuo Kyuma et al., *Opto-electronics, Devices and Technologies* vol. 8, No. 1, Mar. 1993.

"Artifical Retina devices—Fast Front Ends for Neural Image Processing Systems," by Eberhard Lange et al., *Proceedings of 1993 International Joint Conference on Neural Networks.*

*Primary Examiner*—Leo Boudreau
*Assistant Examiner*—Wenpeng Chen
*Attorney, Agent, or Firm*—Lowe, Price LeBlanc & Becker

[57] ABSTRACT

In an image sensing apparatus, an array of two-dimensional matrix of photosensitive devices is used to detect an image. Each photosensitive device comprises a photosensor accumulating carriers when exposed to a light, control terminals, and an output terminal. A signal generator supplies a vector or a one-dimensional data to the control terminals in the array to output pixel data of the two-dimensional matrix, and the pixel signal is output through the output terminal. The control terminals of the photosensors arranged along each line are connected commonly, while the output terminals thereof arranged along each column are connected commonly. A controller supplies control signals to the control terminals. Then, pixel signal for columns designated by a control signal are output through an output circuit connected to the control terminals. Then, a partial region in the array including a region exposed by the light is determined according to the pixel signals, and data on the partial region is sent to the controller. Then, the controller supplies control signals in correspondence to the partial region. Then, correlation operation of the control signals with the amount of carriers in the photosensors are carried out while reading the pixel signals, and the pixel signals in the partial region is output.

20 Claims, 21 Drawing Sheets

IMAGE SENSING DEVICE AND IMAGE SENSING METHOD

BACKGROUND OF THE INVENTION

1. Field of the Invention

The present invention relates to image sensing by using a two dimensional array of sensor cells.

2. Description of the Prior Art

There are known various image sensing apparatuses having a two dimensional array of sensor cells. When the array is exposed by a light or an image, the position of the light or image is detected by processing signals from the sensor cells. A character written with a light spot on the array can be recognized. However, in the image sensing apparatus, even if only a part of the input image is needed for image sensing, all the input image is processed, and this causes various problems.

For example, in a prior art image sensing apparatus, a two-dimensional matrix comprises pairs of a photodiode and a transfer gate, and vertical charge coupled device for each array of the pairs of a photodiode and a transfer gate. When a light spot illuminates the matrix, signals of the photodiodes are transmitted through the transfer gates to the vertical charge coupled device, and the signals in the vertical charge coupled devices are further transmitted to a horizontal charge coupled device. The signals in the horizontal charge coupled device is amplified and sent to the external. Charges stored in all the photodiodes are transferred successively by the vertical and horizontal charge coupled devices. Then, the position or peak coordinates of the light spot is determined. However, even if only a part of input image is used to detect the position of the light spot, the prior art position detector reads all the image in the two-dimensional array. Therefore, it is difficult to shorten response time of position detection.

In a prior art image sensor as disclosed in Japanese Patent Publication 63-293427/1988, when a light spot illuminates a charge coupled device image censor, brightness signal at each pixel and coordinates of the pixel are sent to an image processor successively. The image processor calculates a center of gravity of the light spot to detect peak coordinates thereof. Because the intensity distribution of light beam is usually Gaussian, the center of gravity is obtained from standard deviation along X axis. The calculation of the peak coordinates of light spot needs image information only around the spot. However, the image sensor outputs all the image data including unnecessary information. In order to reduce noise components included in the input light and the detection circuit, the coordinates are calculated after averaging a plurality of spot images. In the noise reduction process, unnecessary information is also amplified to cause bad influences such as enhancement of errors. That is, even if the noise components included in the input light and the detection circuit can be reduced, total noises cannot be reduced, and this inhibits improvement of precision in image detection.

A prior art position sensitive detector as disclosed in Japanese Patent Publication 62-184304/1987 comprises a pair of one-dimensional detectors for X and Y coordinates, and each one-dimensional detector comprises a photosensitive layer and two electrodes provided at two ends of the layer. When a light spot illuminates the detectors, currents flowing though the electrodes to the ground are measured, and the peak position thereof is calculated from the currents. However, in the position sensitive detector, it is difficult to detect the coordinates at high precision because its typical resolution is about 100 * 100 points. Further, even if various sizes of light spots are used at the same time, the position of a light spot having a prescribed size cannot be detected because only the peak position is calculated. Then, it takes a long time to discriminates the optical spots.

In a prior art image sensing apparatus using character recognition, when a character image written with a light spot is read by a scanner, the image data are divided into regions. Then, in each region, the existence of a character is recognized and features thereof are extracted. Then, pattern matching is performed by using the feature data. However, in the image sensing apparatus, a whole character is divided to extract feature data and to perform pattern matching. Then, a sequence of writing the character with a spot cannot be used as a feature of character recognition. Further, this restricts improvement of precision of recognition and computation speed.

SUMMARY OF THE INVENTION

An object of the present invention is to provide an image sensing device which can shorten response time by dealing only a necessary part in a whole image data.

Another object of the present invention is to provide an image sensing device which can detect a spot at a high precision.

A further object of the present invention is to provide an image sensing device which can detect a spot in a plurality of peak spots.

A different object of the present invention is to provide an image sensing device which can recognize a character by detecting sequence of writing the character.

An image sensing apparatus of the invention comprises an array of two-dimensional matrix of photosensitive devices. Each photosensitive device comprises a photosensor accumulating carriers when exposed to a light, control terminals, and an output terminal. A signal generator supplies a vector or a one-dimensional data to the control terminals in the array to output pixel data of the two-dimensional matrix, and the pixel signal is output through the output terminal. The control terminals of the photosensors arranged along each line are connected commonly, while the output terminals thereof arranged along each column are connected commonly. A controller supplies control signals to the control terminals, and pixel signal are output through an output circuit connected to the control terminals to output the pixel signals for columns designated by a second control signal. Then, a determination means receives the pixel signals and determines a partial region in the array including a region exposed by the light according to the pixel signals received, and outputs data on the partial region to the controller. Then, the controller supplies control signals in correspondence to the partial region. Then, various kinds of correlation operation of the control signals with the pixel signals of the photosensors are carried out, and the pixel signals in the partial region are output. For example, by providing appropriate control signals, a light spot of a prescribed size can be detected. Further, various operations on the pixel data are possible. For example, when a character is written with a light spot, the pixel data are stores successively in time, and a writing sequence of the character can be detected.

An advantage of the present invention is that an image is sensed by dealing only a necessary part in a whole image data.

Another advantage of the present invention is that an image data is output while performing correlation operation with pixel data.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
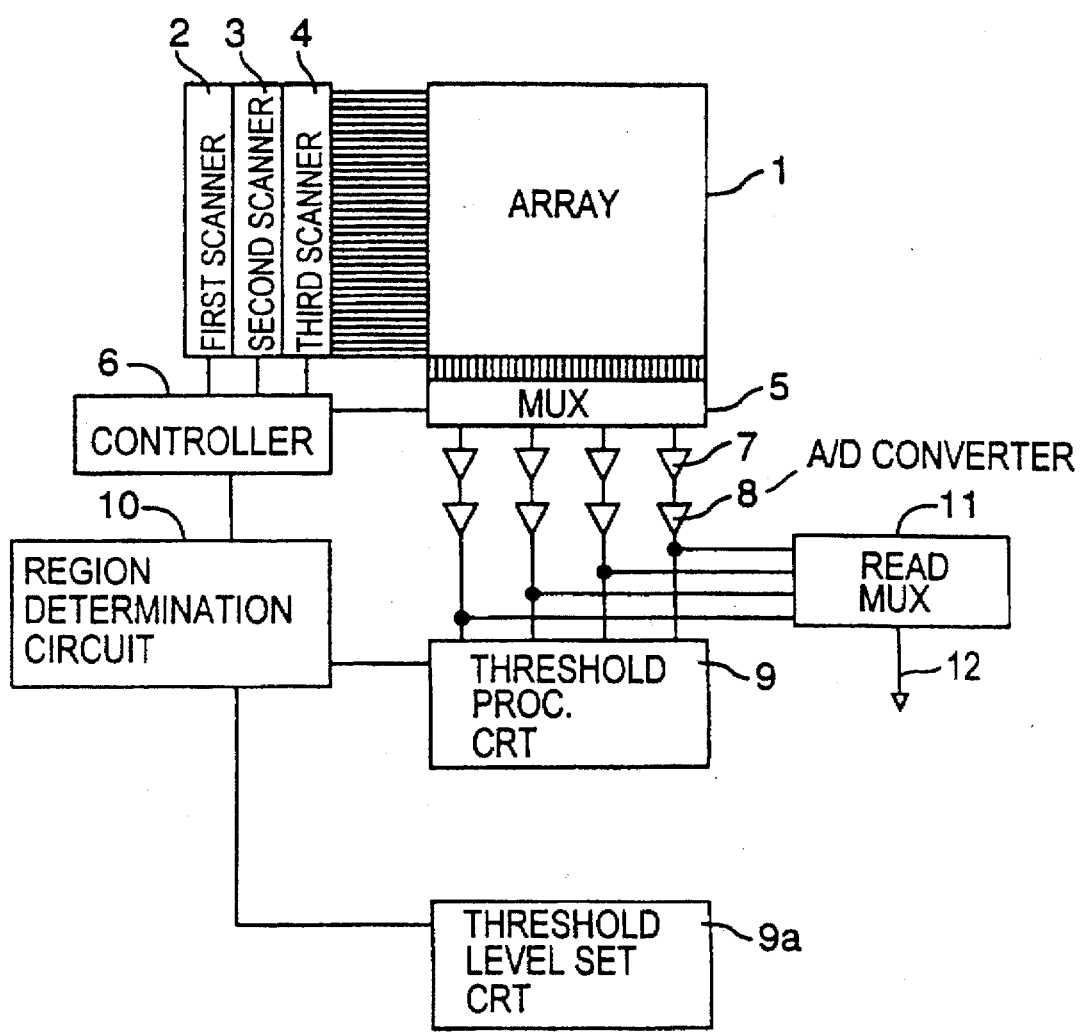
FIG. 1 is block diagram of an image sensing apparatus of a first embodiment of the invention.

Referring now to the drawings, wherein like reference characters designate like or corresponding parts throughout the views, FIG. 1 shows an image sensing apparatus of an embodiment of the invention. A sensor cell array 1 made of a two-dimensional array (4*4 array in this examples) of sensor cells (or photosensors) is reset through a third scanner 4 by a controller 6 which generates a control vector $S_j$ and a reset signal pattern to be supplied to each scanner. Then, a light (an image) illuminates the sensor cell array 1, and charges are accumulated in the sensor cells. The controller 6 sends a control signal through a first scanner 2 and a second scanner 3 to the array 1, and the array 1 responds to the control signal to send an output signal through a multiplexer (MUX) 5, four amplifiers 7 connected to the multiplexer 5, and four analog-to-digital (A/D) converters 8 connected to the amplifiers 7, to a threshold processing circuit 9 which determines to output a signal or not according as a receive signal exceeds a threshold level or not. The numbers of the amplifiers 7 and the A/D converters 8 may be set to have a number appropriate for data processing. According to the operation by the threshold processing circuit 9, a region determination circuit 10 determines a region on which an image is to be read in correspondence to an input timing. The controller 6 generates a control signal for reading signals only of the region determined by the circuit 10. Then, signals only of the region are read from the array 1 through the multiplexer 5, the amplifiers 7 and A/D converters 8 to a read multiplexer 11 to be output through a read terminal 12. It is to be noted that only the first scanner 2 among the three scanners is a random scanner in the example.

Figure 2:
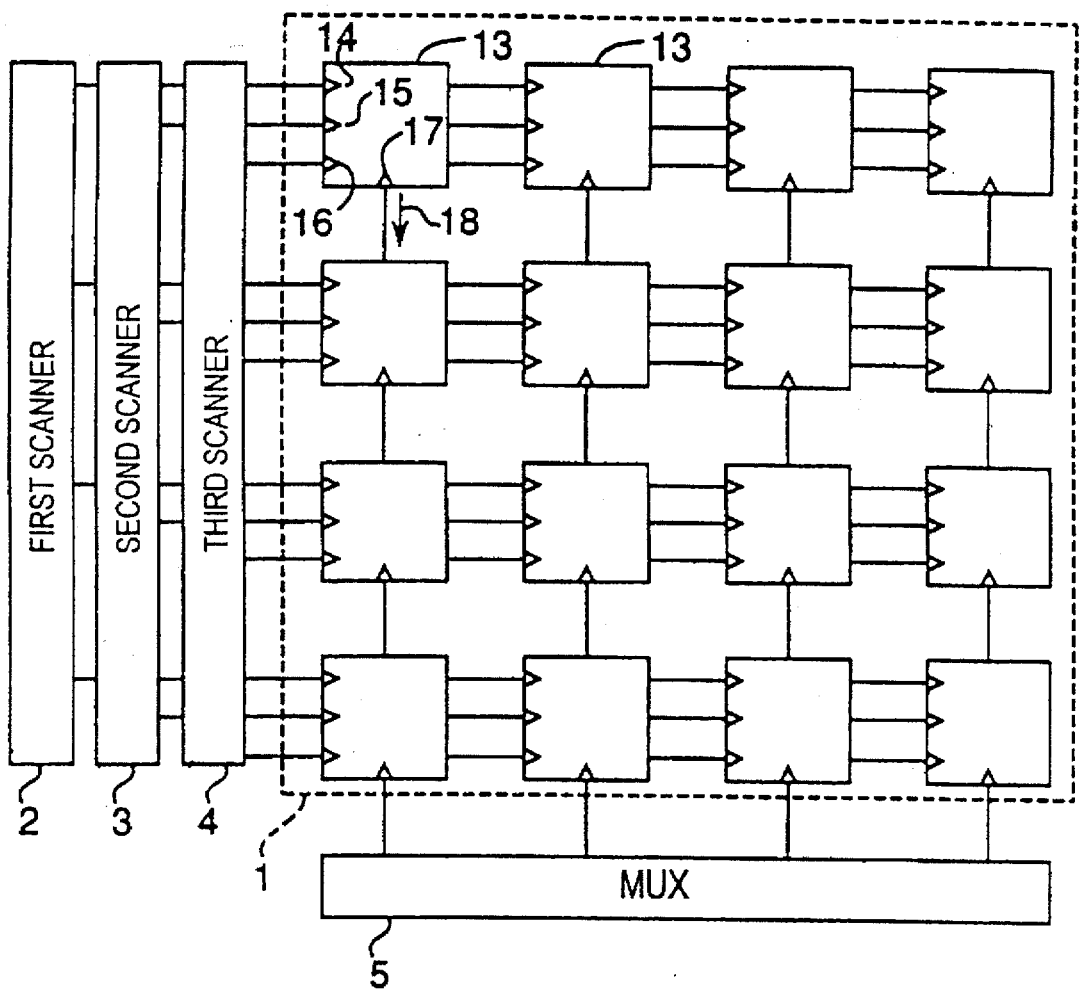
FIG. 2 is a block diagram of sensor cells and peripherals of the image sensing apparatus.

Next, operation of each block in the apparatus is explained. First, sensor cells are explained. FIG. 2 shows an example of arrangement of sensor cells 13 in the sensor cell array 1. The sensor cell array 1 is composed of a matrix of four columns and four lines of the sensor cells 13 in this example for the ease of explanation. (Actually, the sensor cell array 1 is composed of a matrix of, for example, 640*480 pixels.) Each sensor cell 13 has three control terminals of an H terminal 14 for receiving a positive control signal, an L terminal 15 for receiving a negative control signal, and a C terminal 16 for resetting the cell 13, and an output terminal 17 for outputting an output signal 18. Signals supplied by the first to third scanners 2–4 to the three control terminals 14–16 are common to sensors 13 in a line.

When a light illuminates the sensor cell array 1, carriers are generated and accumulated in the sensor cells 13. When a H-level pulse is received at the C terminals 16, the accumulated carriers are reset to bring the sensor cells 13 in the initial state. When an H-level pulse is received at the H terminals 16 after charges are accumulated, they can be read as an output current $I_{out}$. On the other hand, when an H-level pulse is received at the L terminals 15 after charges are accumulated, they can also be read as an output current $I_{out}$, but the direction of the current is reversed. The output current $I_{out}$ due to accumulated charges in the sensor cell 13 can be derived as follows:

$$I_{out} = S_i \cdot W_{ij} \qquad (1)$$

where i and j represent line and column in the two-dimensional array 1, $W_{ij}$ represents input light power at the sensor cell 13 at i-th line and j-th column, and $S_i$ represents a sensitivity (+1, 0 and −1 in this example) set by input voltages $V_H$ and $V_L$ at the H and L terminals 14 and 15 for i-th line.

Figure 3:
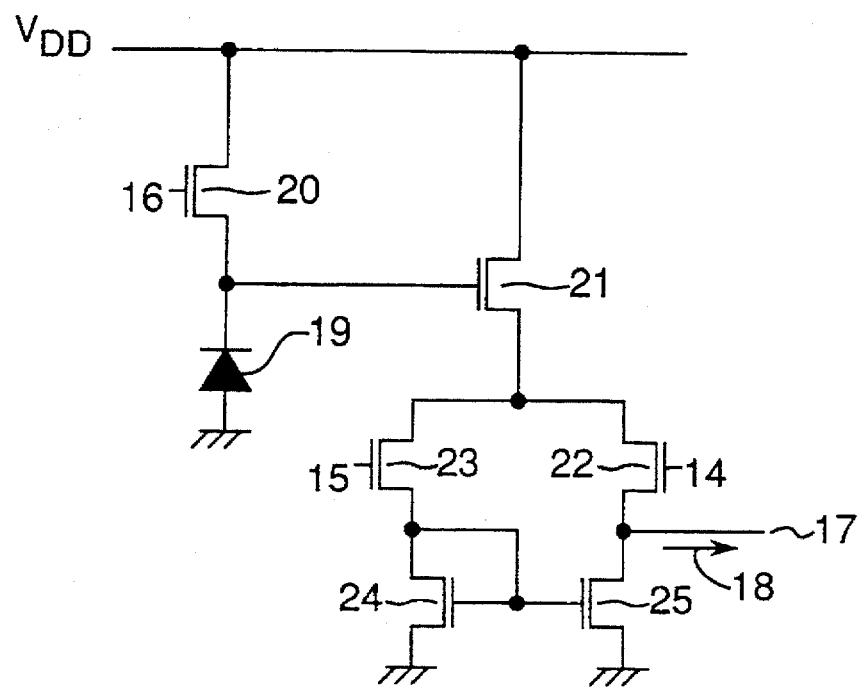
FIG. 3 is a circuit diagram of the sensor cell.

FIG. 3 shows an example of a circuit of a sensor cell 13. When a transistor 20 for charging is turned on by a signal at the C terminal 16, the internal voltage of a photodetector 19 is reset as power source voltage $V_{DD}$. After the transistor 20 is turned off, a light illuminates the photodetector 19. Then, the internal voltage decreases according to the quantity of light. If the H terminal 14 is set at H-level in this state, a high-SW transistor 21 is turned on, and the signal converted by an AMI (amplified MOS image) transistor 22 to a current is output to the output terminal 17 as a positive output current 18. On the other hand, if the L terminal 15 is set at L-level in this state, a low-SW transistor 23 is turned on, and the signal converted by the AMI (amplified MOS image)

transistor 21 to a current is output through a mirror transistor 24 and a low-out transistor 25 to the output terminal 17 as a negative output current 18. The output of the low-SW transistor 23 is connected to the gates of the transistors 24 and 25. In this circuit, the current is maximum when no light illuminates the photodetector 19, and it decreases with increasing quantity of light. That is, an inverted current is supplied. If the output current under no illumination is denoted as $I_{out}(0)$, the output current is represented as follows:

$$I_{out} = I_{out}(0) - S_i W_{ij}. \qquad (2)$$

Effects of the inversion are only the inversion of the sign of the current (if compared with Eq. (1)) and the generation of an offset.

Next, operation of the two-dimensional sensor cell array 1 of sensor cells 13 is explained. As shown in FIG. 2, the C terminals 16 of the sensor cells 13 are connected to the third scanner 4 for each line of the matrix. If the scanner 4 supplies an H-pulse for each line successively, all the array 1 is reset. The H terminals 14 of the sensor cells 13 are connected to the first scanner 2 for each line, and the first scanner 2 supplies voltage $V_H$ to the H terminals 14. Similarly, the L terminals 15 of the sensor cells 13 are connected to the second scanner 3 for each line. Read sensitivity $S_i$ of i-th line is determined by the voltage $V_H$ supplied by the first scanner 2 and the voltage $V_L$ supplied by the second scanner 3. That is, $S_i=+1$ if $V_H=+1$ and $V_L=0$, $S_i=0$ if $V_H=0$ and $V_L=0$, $S_i=-1$ if $V_H=0$ and $V_L=1$, and a condition of $V_H=+1$ and $V_L=+1$ is forbidden. Further, the output terminals 17 are connected in common for each column to the amplifier 7. Then, output current $Y_j$ of j-th column is represented as follows:

$$Y_j = \Sigma S_i W_{ij}. \qquad (3)$$

This means that a product of an input image vector $\{W_{ij}\}$ and the control vector $\{S_i\}$ of i-th line in Eq. (2) is calculated when the sensor cell array 1 is read. As explained above, $S_i$ is determined by the voltages $V_H$ and $V_L$ to be +1, 0 or −1.

Figure 4:
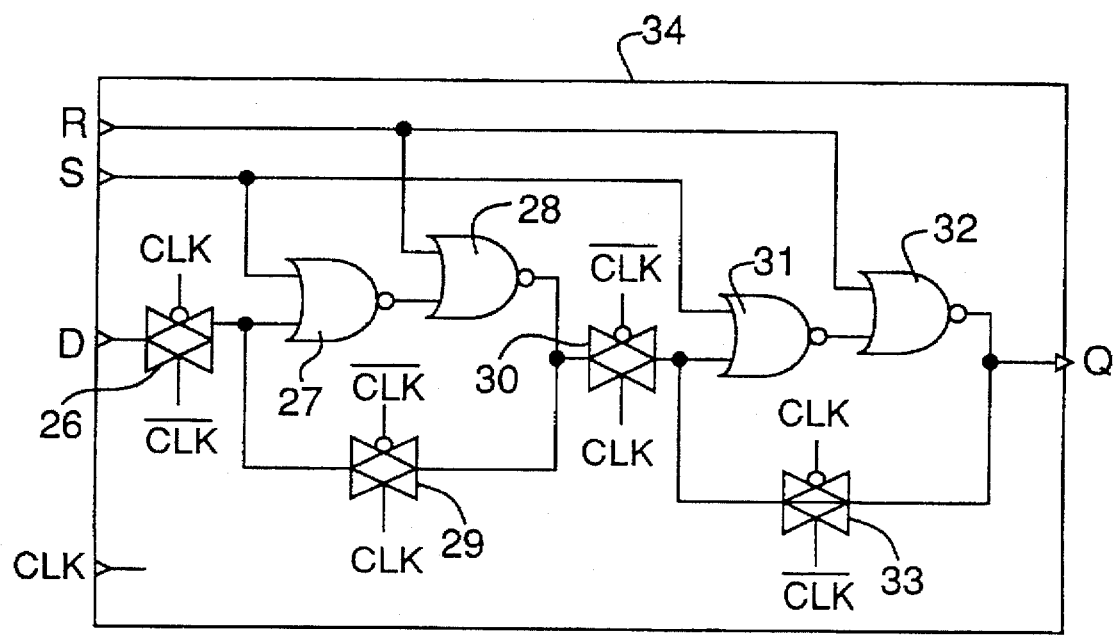
FIG. 4 is a circuit diagram of D-flip flop including transmission gates of the image sensing apparatus.

Next, the scanners 2, 3 and 4 are explained. The scanners 3 and 4 comprise delayed flip flops (D-FF) 34. FIG. 4 shows a delayed flip flop 34. A signal input through a D terminal is transmitted through a transfer gate 26 to a NOR gate 27, while clock signals (CLK and $\overline{CLK}$) are applied to the transfer gate 26. A set signal S is supplied to the other input of the NOR gate 27 and to an input of a NOR gate 31. An output of the NOR gate 27 is supplied to an input of a NOR gate 28. The output of the transfer gate 26 is also supplied through another transfer gate 29 to the output of the NOR gate 28. A reset signal R is supplied to the other input of the NOR gate 28 and an input of a NOR gate 32. An output of the NOR gate 28 is supplied through a transfer gate 30 to the other input of the NOR gate 31. The output of the transfer gate 30 is also supplied through another transfer gate 33 to an output of the NOR gate 32 which is output as an output signal Q.

In the delayed flip flop 34, the signal at the terminal D is transmitted according to the clock signals to the NOR gate 28, while signals supplied to the terminals R and S are supplied to the NOR gates 28, 29, 32 and 33. The result of the operation is output at the terminal Q.

Figure 5:
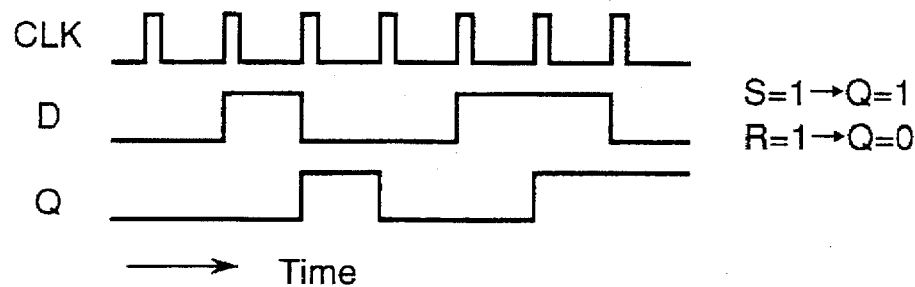
FIG. 5 is a timing chart of the D-flip flop.
Figure 6A:
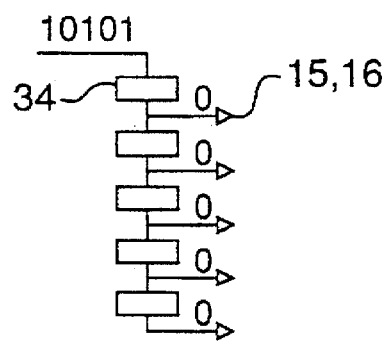
FIGS. 6A–6E are diagrams of scanner illustrating the input and output of the scanner at successive stages.
Figure 6B:
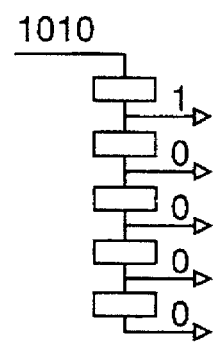
Figure 6C:
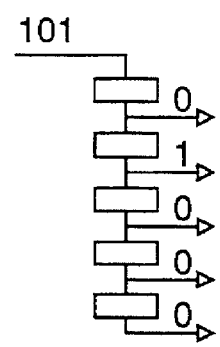
Figure 6D:
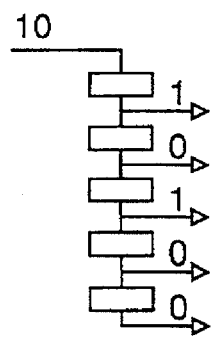
Figure 6E:
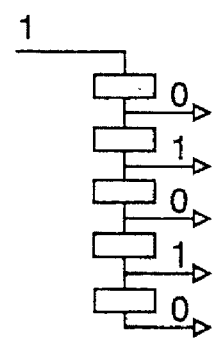

FIG. 5 shows an example of a timing chart of the flip flop 34. At first, R=S=0. It is understood that the signal at the terminal D is delayed by one clock to be output at the terminal Q as signal of "1". When R=0 and S=1, a signal of "1" is output at the terminal Q, while when R=1 and S=0, a signal of "0" is output at the terminal Q.

FIGS. 6A–6E show a series connection of five delayed flip flops 34 as an example in the scanners. A control pattern of "10101" supplied from the controller 6 is input to the terminal D at the delayed flip flop 34 for the top line, and it is transferred successively as shown in FIGS. 6A to 6E. The terminal Q of the delayed flip flop 34 for the top line is connected to the L or C terminals 15 or 16 of the sensor cells 13 for the scanner 3 or 4 and to the terminal D of the delayed flip flop 34 at the second line, and the delayed flip flops 34 from the second to the fifth lines are also connected similarly. Thus, the scanner transfers the input pattern successively. In the scanner 3, the signal is supplied successively to the L terminal 15 to repeat transfer until it reaches to a desired line. When the sensor cells 13 are reset, the third scanner 4 supplies a "1" signal successively.

Figure 7:
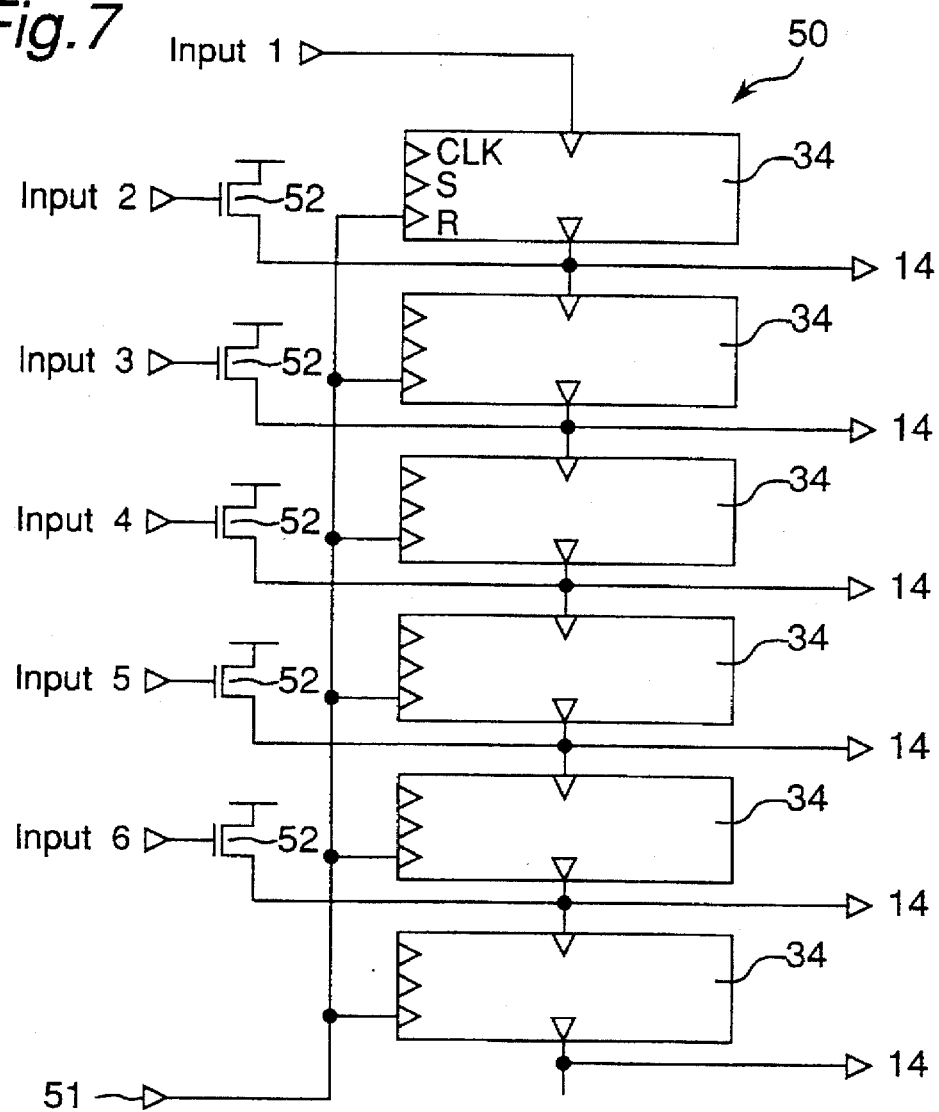
FIG. 7 is a block diagram of a random scanner using the D-flip flops of the image sensing apparatus.

Next, FIG. 7 shows a random scanner 50 used as the first scanner 2. This scanner 50 is different from the scanner shown in FIG. 6 in that the terminals R are connected commonly to a reset terminal 51 and that first to sixth input terminals are connected through nMOS transistors 52 to connections between the delayed flop flops 34. If the input signals to the terminals D at the delayed flip flops 34 except the top line and the reset signal are set as "0", the scanner operates similarly to that shown in FIG. 6. It can be transferred from an intermediate line if it is input at any of the input terminals except the top one. If the reset signal is set as "1", the outputs of all the delayed flip flops 34 become "0" and the transfer is completed. Thus, a pattern can be input from an intermediate line and output to another intermediate line.

Because the sensor array 1 operates multiplication and sum as shown in Eq. (3), various image detection and processing can be operated by combining the array 1 with the scanners. For example, if the control signal is set as "+1" for the first line and "0" for the other lines, image signals only of the first line can be read. By transferring the signal "+1", all the image can be detected. If the control signal is set as "+1" for the first line, "−1" for the second line and "0" for the other lines, a difference of image signals between the first and second lines can be read. By transferring the control pattern, an image with emphasized contour can be output successively. If a control vector is a desired one-dimensional pattern, correlation signals between the input image and the one-dimensional pattern can be output. This means that one-dimensional pattern matching can be performed.

As mentioned above, by operating the random scanner, the transfer of H signal of the scanner 1 is started from an intermediate line and completed at another intermediate line. This means that a desired range of image can be read along line direction. Thus, when the multiplication and sum operation or the correlation operation is combined with the random scanner, if a desired region is set according to result of the operation, an image can be read be setting a read region.

Next, the multiplexer 5 is explained. In the circuit shown in FIG. 1, the multiplexer 5 has four outputs, and the multiplexer 5 is constructed from four unit circuits shown in FIG. 8. The unit circuit controls the outputs of the two-dimensional array 1 by using a random scanner 36 similar to that shown in FIG. 7. The output terminals 17 for a column are connected through a gate transistor 37 to a common output. The outputs of the random scanner 36 are connected to gates of the transistors 37. Therefore, the random scanner 36 can set a transistor to be turned on. Control vectors are set for the first to third scanners 2–4, and image data are read successively along column direction by the multiplexer 5.

Figure 8:
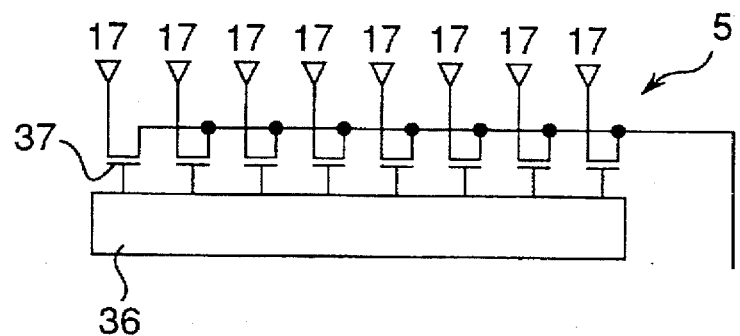
FIG. 8 is a block diagram of a multiplexer of the image sensing apparatus.
Figure 9:
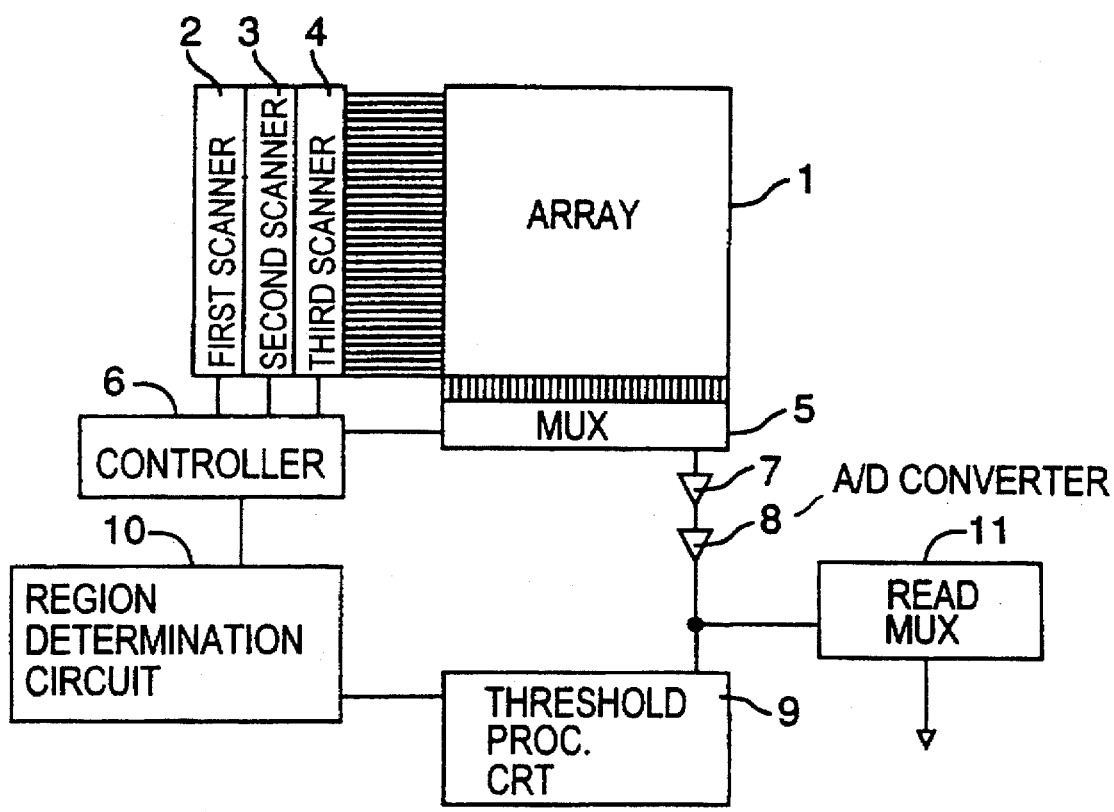
FIG. 9 is a block diagram of a modified example of the image sensing apparatus having a multiplexer having only one output.

The randomness makes it possible to read data in a desired range along column direction. Further, by combining the randomness of the first scanner 2, an image in a desired region can be read. That is, the first scanner 2 controls a read region along line direction, while the random scanner 36 in the multiplexer 5 controls a read region along column direction, so that a read region can be controlled in two dimensions. In a modified example shown in FIG. 9, the multiplexer 5 has only one output, and it has the same circuit as shown in FIG. 8.

Figure 10A:
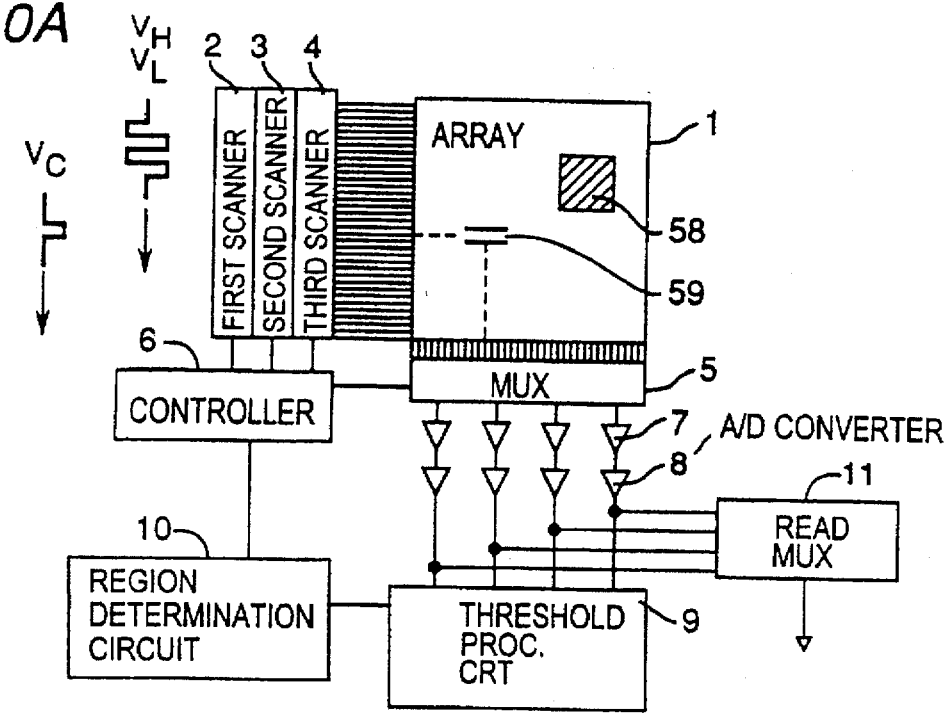
FIGS. 10A and 10B are block diagrams for explaining the operation of the image sensing apparatus.
Figure 10B:
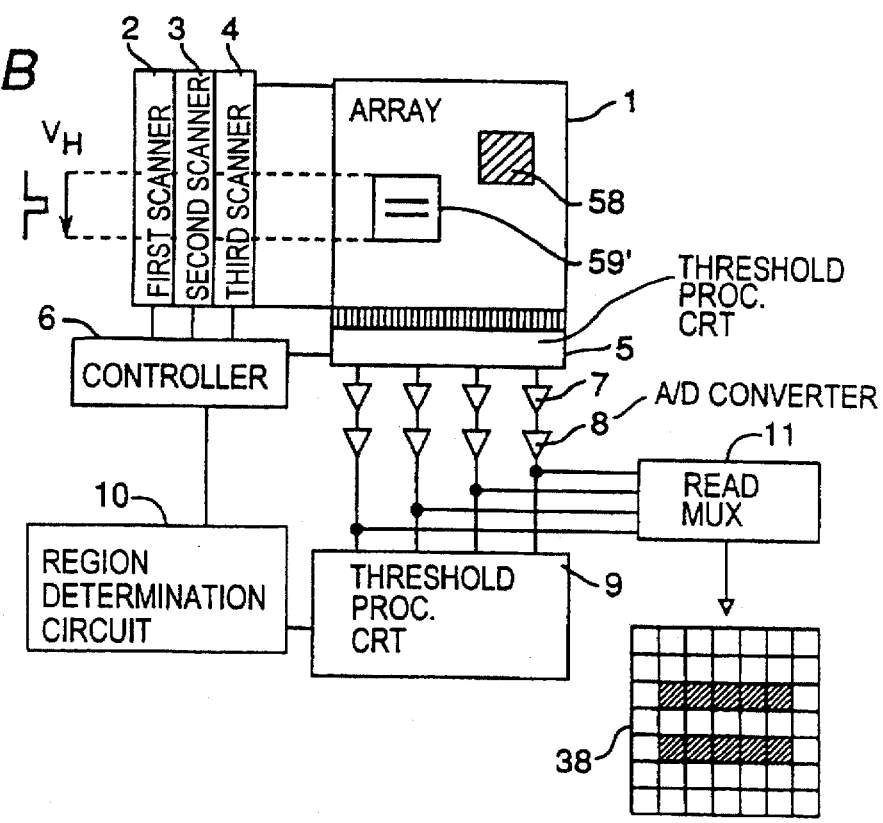

Next, image detection using the image sensing apparatus is explained with reference to FIGS. 10A, 10B and 11. In the flow shown in FIG. 11, in a first stage, charges in all the sensor cells 13 in the array 1 are reset by the control signal $V_C$ (refer to the $V_C$ signal at the left side in FIG. 10A) from the third scanner 4 (step S1). Next, a light or an image is illuminated onto the array 1, and carriers as image signals are generated in the sensor cells 13 (step S2). For example, as shown in FIG. 10A, there is a case where an image consists of a square image 58 and a parallel-line image 59, and the parallel line image 59 is assumed to be intended to be detected. Then, the control signals $V_H$ and $V_L$ having a one-dimensional pattern of (+1, −1, +1, −1, 0, 0, . . . ) is generated in correspondence to the parallel lines 59 from the first and second scanners 2 and 3 (refer to the $V_H$ and $V_C$ signals at the left side in FIG. 10A). Pattern matching or correlation operation as a feature of the invention is performed by using the one-dimensional pattern (step S3). The correlation operation is performed on a matrix having elements representing accumulated charges in the sensor cells 13 with a vector or a one-dimensional pattern in correspondence to the image to be observed. The correlation operation is performed to output pixel data of the accumulated carriers in the sensor cells 13 at a prescribed order. Further, it is also possible to perform operation on the pixel data at the same time. For example, contour emphasis is performed by supplying an appropriate one-dimensional pattern. Then, the result of the pattern matching is sent through the multiplexer 5, the amplifiers 7 and the A/D converters 8 to the threshold processor 9 where the position of the parallel line image 59 is detected (step S4).

Next, in the second stage, the region determination circuit 10 determines a read region (or access region) 59' by taking the size of the parallel lines 59 into account (step S5). That is, the read region 59' is determined so as to include the pattern to be detected. Then, the first scanner 2 sends the control signal in correspondence to the read region 59' along line direction (refer to $V_H$ signal at the left side in FIG. 10B), while the random scanner in the multiplexer 5 receives the control signal along column direction. Thus, pixel signals of a partial image 38 in the read region 59' shown in FIG. 10B are read through the read multiplexer 11 (step S6). Thus, the two parallel lines 59 in the whole image can be extracted. The pattern to be detected can be set freely by changing the control vector supplied to the scanners. If there is no pattern to be detected, no pixel signals are read out.

Figure 11:
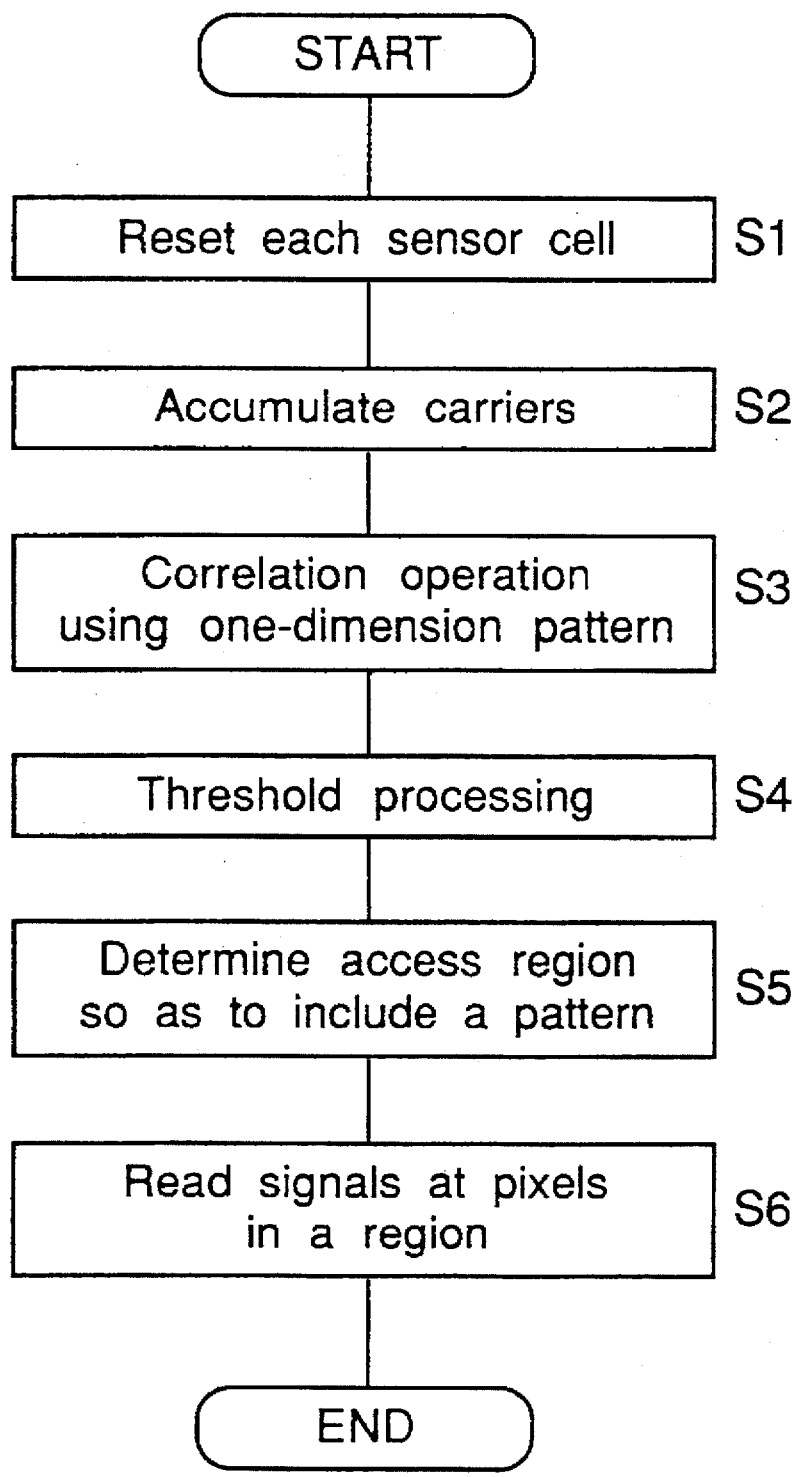
FIG. 11 is a flowchart of image sensing in the first embodiment.
Figure 12:
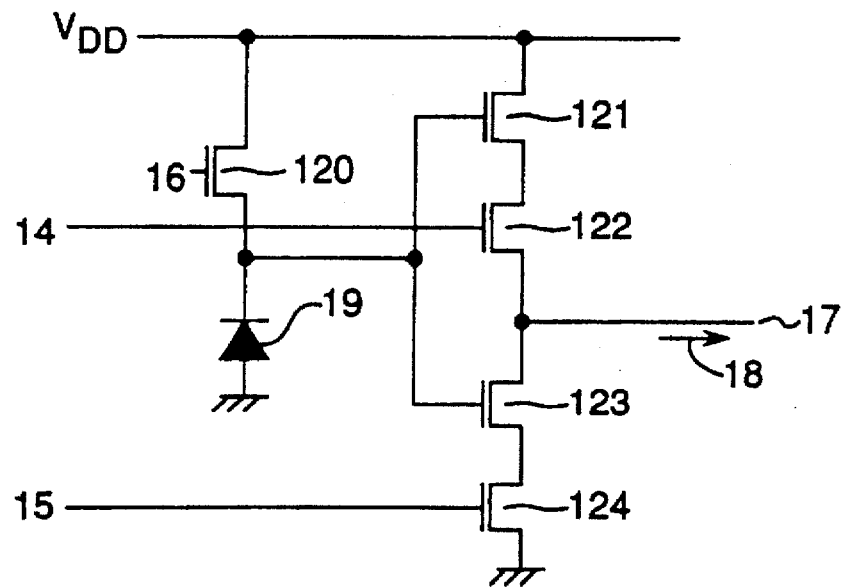
FIG. 12 is a circuit diagram of another example of sensor cell included in an image sensing apparatus.

FIG. 12 shows a modified example of the sensor cell different from that shown in FIG. 3. Similarly to the cell shown in FIG. 3, when a transistor 120 for charging is turned on by a signal at the terminal 16, the internal voltage of a photodetector 19 is reset as power supply voltage $V_{DD}$. Then, a light or image illuminates the photodetector 19, and the internal voltage decreases according to the quantity of light. If the H terminal 14 is set at H-level in this state, a high-SW transistor 122 is turned on, and the signal converted by an AMI (amplified MOS image) transistor 121 to a current is output to the output terminal 17 as a positive output current 18. On the other hand, if the L terminal 15 is set at H-level in this state, a low-SW transistor 124 is turned on, and the signal converted by an AMI (amplified MOS image) transistor 123 to a current is output to the output terminal 17 as a negative output current 18. The transistors 121–124 are connected in series between $V_{DD}$ and the ground. In the circuit shown in FIG. 11, positive and negative signals can be read out by the control signals at the H and L terminals 14 and 15.

In the example explained above, only one pattern in an input image is detected. However, two or more patterns can also be detected. For example, in an example shown in FIG. 10A, two one-dimensional patterns in correspondence to the square image 58 and the image 59 of the parallel line image are sent successively. Thus, the two images 58 and 59 are detected, and two access regions (read regions) are set according to the result of the detection. Then, images in the access regions are read successively. If there are regions difficult to be read, an image processor or the like may be provided for correct decision of the regions after the regions are read.

In the example of image detection explained above, the data in the access region are read and the as-read data are output without further operation. However, when an image is read, the data in the access region can be read by operating calculation. For example, operations on the pixels such as contour emphasis may be performed. In a case of contour emphasis, the second scanner 3 also comprises a random scanner as shown in FIG. 7. Further, at step S6 in the flow shown in FIG. 11, the first and second scanners 2 and 3 sends one-dimensional patterns {+1, −1, 0, 0, . . . } as control signals to lines in a region to be read, in order to read the lines. Then, a partial image of the parallel line 59 with contour emphasis is output instead of the image 38.

A circuit 9a is provided for setting a desired threshold level in the threshold processor 9 for regions to be read, as shown in FIG. 1. It can correct intensity distribution (or input efficiency) of the image to be detected. For example, if a light or an image illuminates the sensor cell array 1 with a lens, there is a tendency that the peripheral becomes darker than the center. Therefore, the circuit 9a sets the threshold levels in the threshold processor 9 lower for sensor cells 13 at the peripheral.

Figure 13:
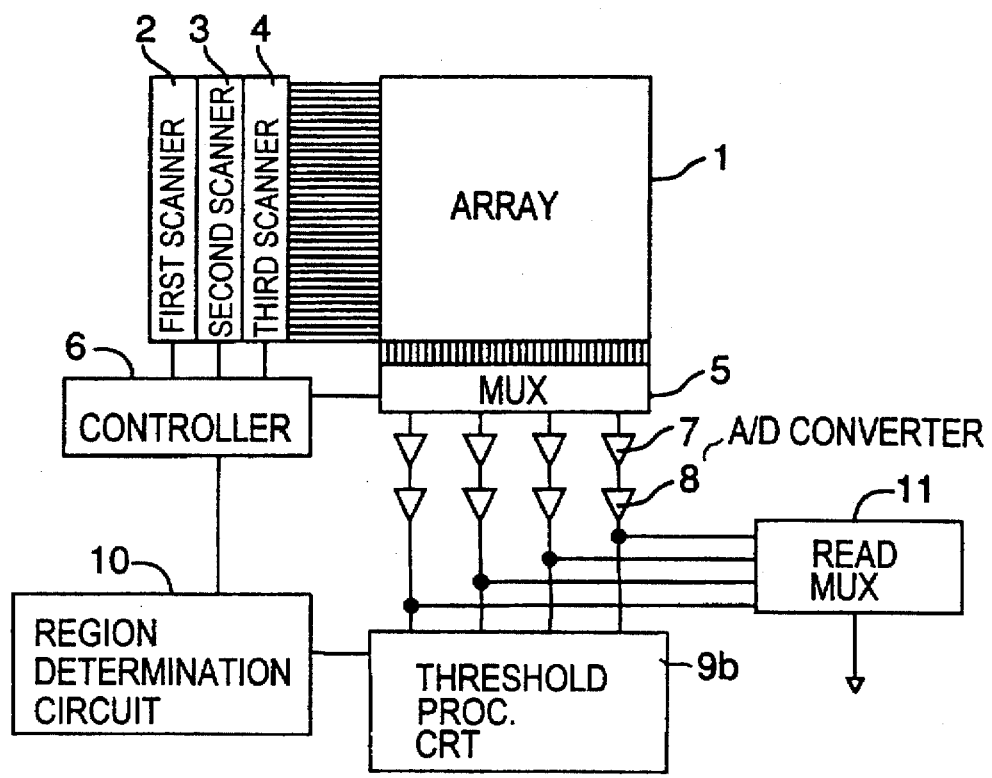
FIG. 13 is a block diagram of an image sensing apparatus of a modified embodiment having a maximum circuit.

In a modified example, as shown in FIG. 13, a maximum detection circuit 9b replaces the threshold processor 9 shown in FIG. 1. The maximum detection circuit 9b detects a position having a maximum correlation signal on pattern matching to detect the partial image in the access region. On the other hand, a minimum detection circuit (not shown for the brevity of explanation) may replace the threshold processor, and the minimum detection circuit detects a position having a minimum correlation signal on pattern matching to detect the partial image in the access region. The maximum or minimum detection is performed at step S4 in FIG. 11.

The resolution can be decreased in pattern matching at step S3 in FIG. 11 than the actual resolution of the sensor cell array 1. That is, when image data are read with pattern matching to the threshold processor 9 (or the maximum or minimum detector), the data are not read at every line, but they are read every other line or every three or more lines. As to column direction, the multiplexer 5 also increases gate-on time for every other column or the like, and only the signals for the columns allowed to be transmitted are sent to the amplifiers 7. Read processing at step S6 is performed with the resolution of the sensor cell array or a resolution higher than that on pattern matching. Then, the image detection can be performed at a fast speed, while the precision of image detection can be maintained.

Figure 14:
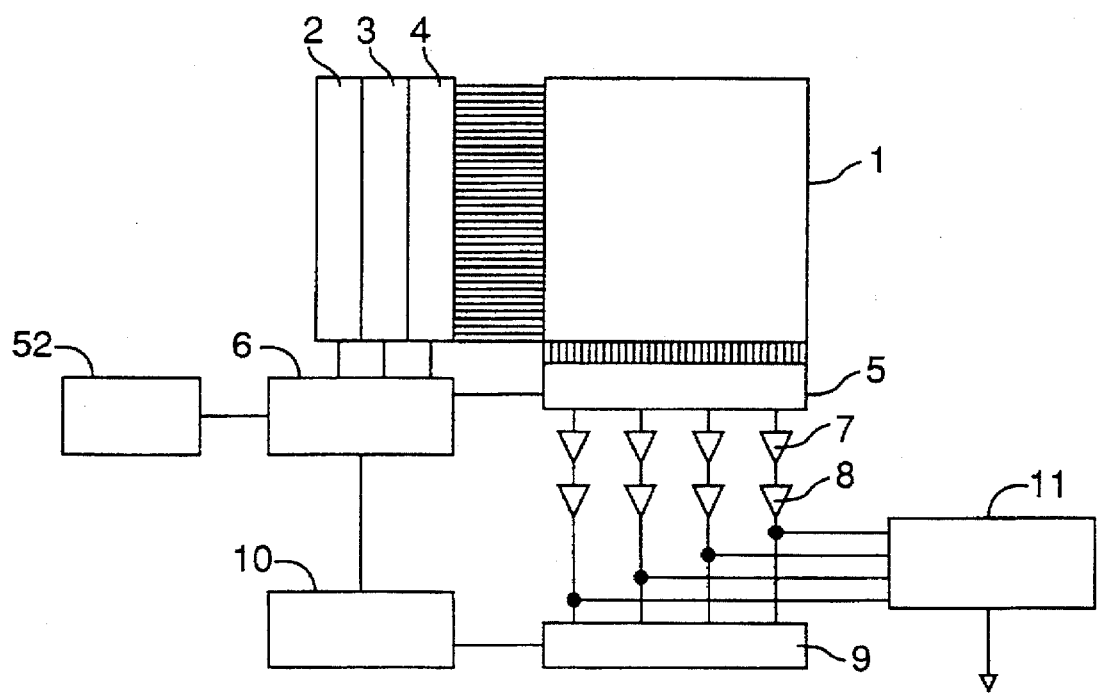
FIG. 14 is a block diagram of an image sensing apparatus of a modified embodiment.

FIG. 14 shows a modified embodiment where a circuit 52 is added for setting an accumulation time to start reading after the sensor cells are reset, according to the brightness of the region to be read. If the region to be read is very bright, the accumulation time is set to be short in order to prevent saturation of the pixel signals. On the other hand, if the region to be read is dark, the accumulation time is set to be long in order to increase S/N ratio. If a plurality of regions are read, the accumulation time can be set different among the regions. Still further, if the conversion range of the A/D converters 8 is changed in synchronization with the setting of the accumulation time, output current or brightness can be detected in a wide range.

Figure 15:
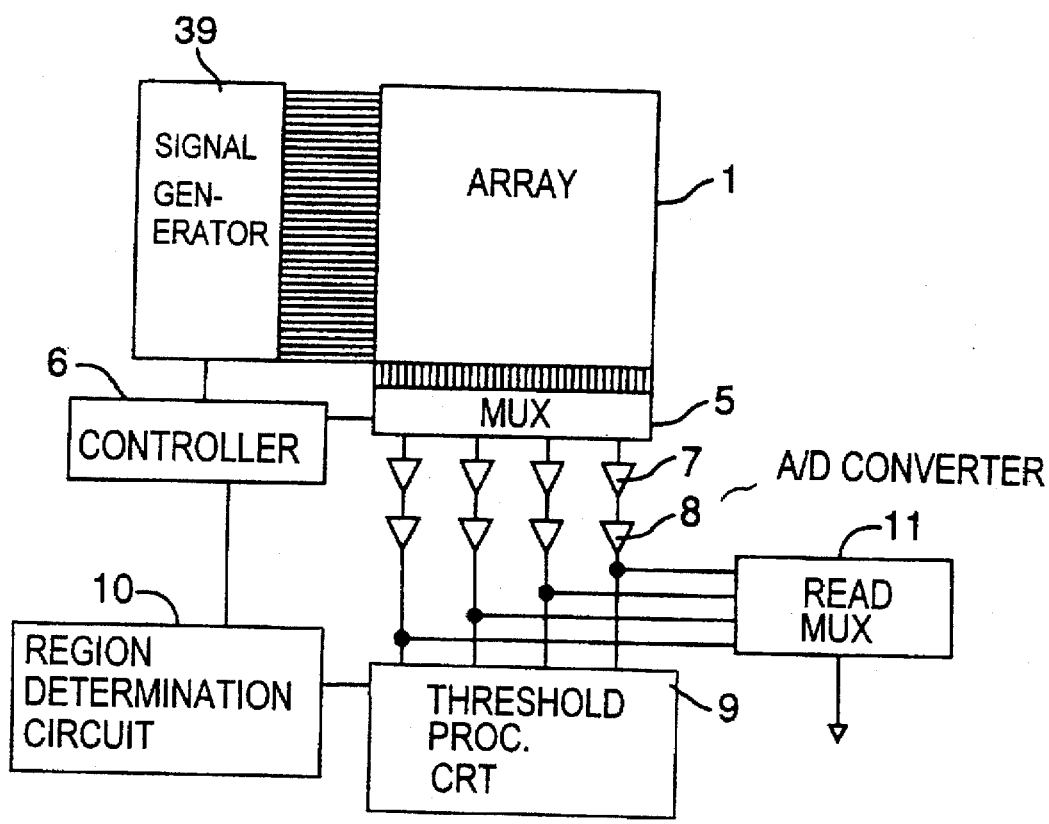
FIG. 15 is a block diagram of an image sensing apparatus.

FIG. 15 shows a modified example where a signal generator 39 comprising a logic circuit is used instead of the three scanners 2–4 shown in FIG. 1. The signal generator 39 supplies signals to the terminals H, L and C of the sensor cells 13. When the scanners 2–4 are used, the fixed vectors are supplied successively by shifting them. On the other hand, the signal generator 39 comprising the logic circuit can supply any vectors successively. That is, any control signals or voltages can be supplied to any line in time series. For example, spatial orthogonal transformation can be carried out by changing a number in a pattern wherein +1's and –1's of the same number are arranged alternately. In order to read a partial image, prescribed signals are supplied to the terminals H and L of the sensor cells of the lines in a determined access or read region, while prescribed signals are supplied to the terminals of the multiplexer 5 in correspondence to the columns in the access region. When an image is processed for orthogonal transformation or Fourier transformation, the signal generator 39 is preferable because of faster and simpler processing thereof.

Figure 16A:
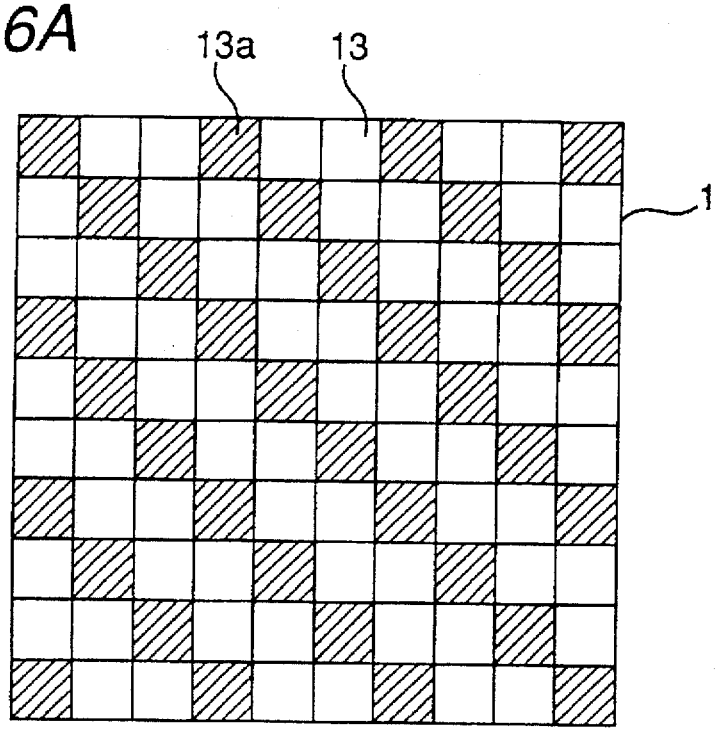
FIG. 16A and 16B are diagrams of a sensor cell array of a image sensing apparatus, the cells in the array including color filters partly.
Figure 16B:
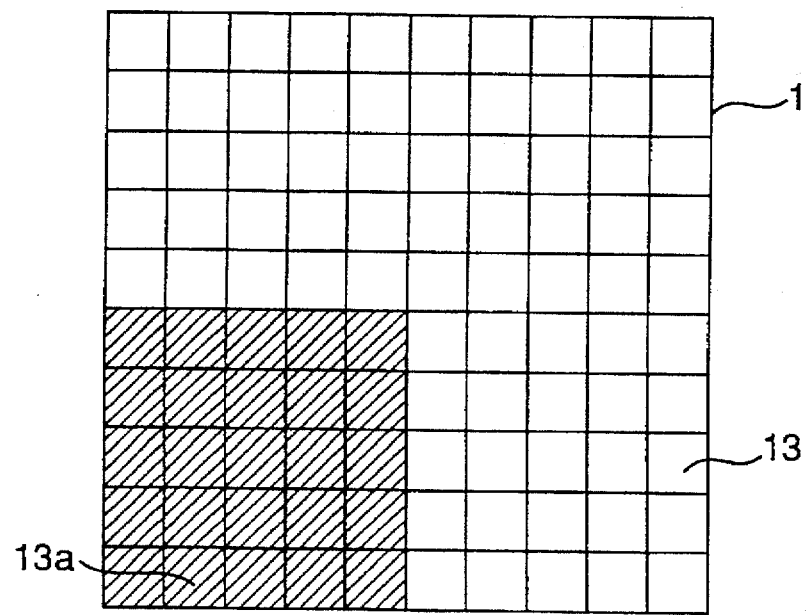

FIGS. 16A and 16B show modified examples wherein a part of the sensor cells 13 in the array 1 have color filters. The examples show the array of 10*10 sensor cells. In the first example shown in FIG. 16A, sensor cells 13a with red filters are arranged in the array 1 every three cells. If an object to be detected has a characteristic red pattern, such as an image including red signals or a person with a red dress, only the sensor cells 13a are used for pattern matching. When the object is read, an ordinary image in a region determined according to the detected pattern can be read by using sensor cells 13 without red filters. As shown in FIG. 16B, sensor cells 13a with red filters may be arranged locally in a prescribed area. Further, the color filters may be filters for other color such as green or blue.

Figure 17:
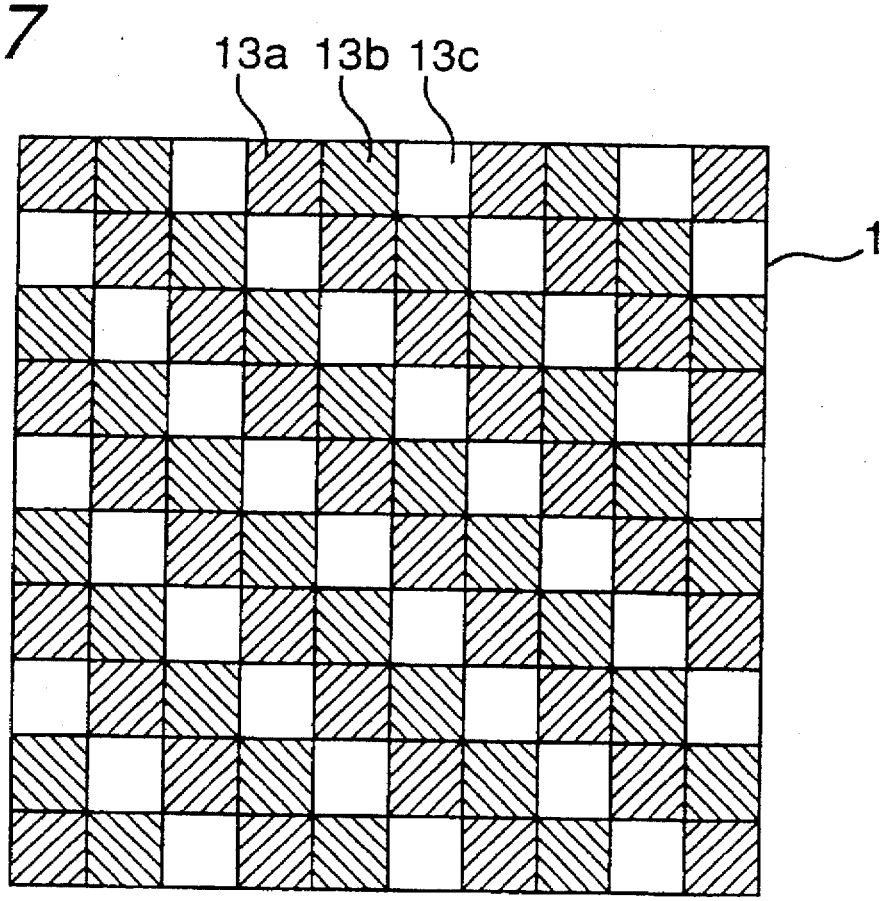
FIG. 17 is a diagram of a sensor cell array of a image sensing apparatus, the cells in the array including color filters partly.

FIG. 17 shows a different example of the array 1 of 10*10 sensor cells having various color filters. The array 1 consists of sensor cells 13a, 13b and 13c having red, green and blue filters. The three kinds of filters 13a, 13b and 13c are arranged periodically. As described in the former examples, pattern matching may be performed on a specified color such as red. Pattern matching may also be performed on every colors. Further, when an image is read, a color image can be detected by using the filters of red, green and blue.

Optical filters which transmit light of wavelengths not of the background, but of the optical spot to be detected, may be overlaid on the image sensing device. For example, when a spot of near infrared rays is detected, cut-off filters for visible light can be overlaid to remove natural light to improve the precision of position detection.

Figure 18:
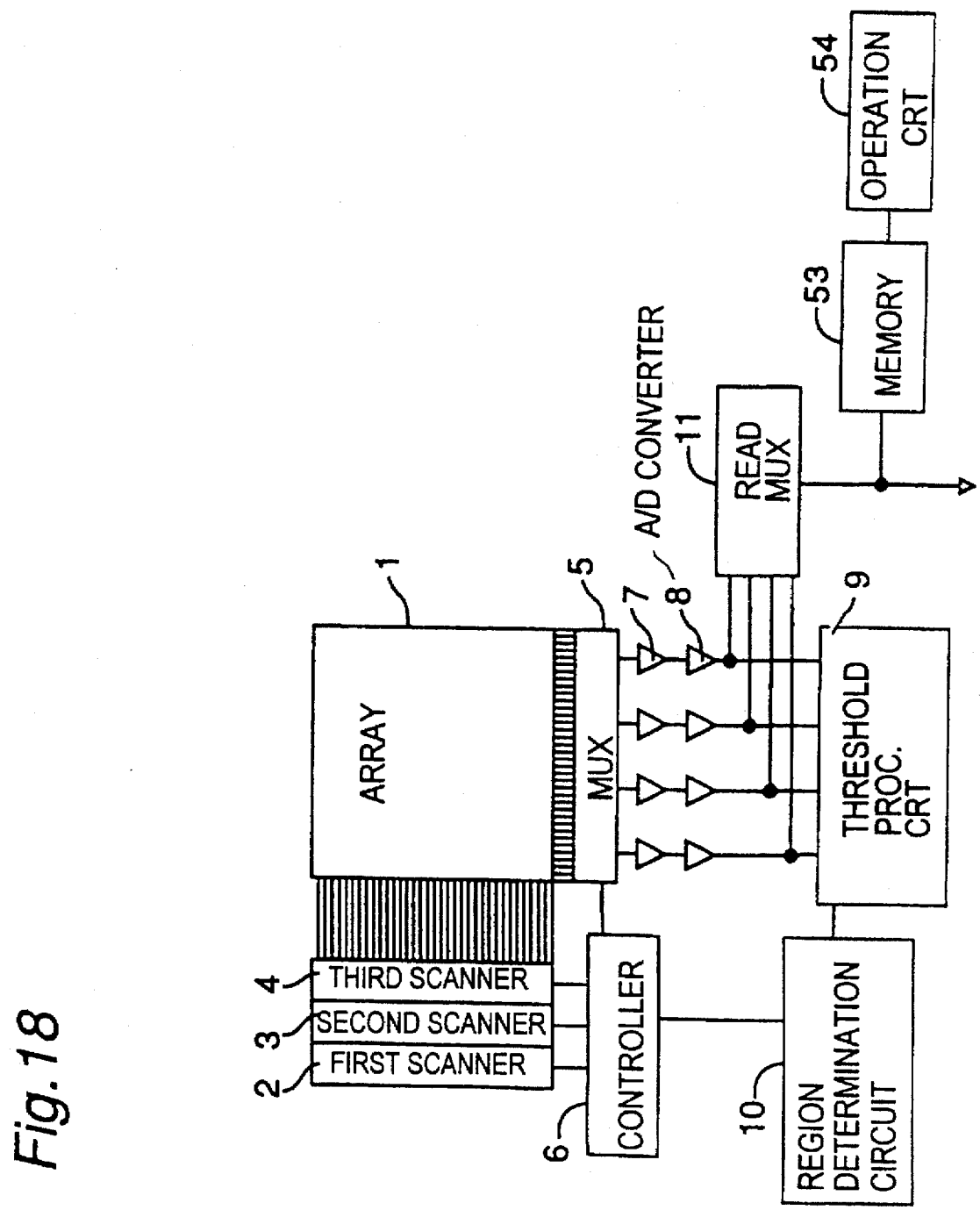
FIG. 18 is a block diagram of an image sensing apparatus.

FIG. 18 shows a modified example of image sensing apparatus wherein a memory device 53 and an operation circuit 54 are connected to the read multiplexer 11 in the device shown in FIG. 1. The memory device 53 stores, for example, a number in correspondence to the number of the sensor cells 13 in a partial image. It may also store a partial image in the access region. The operation circuit 54 performs operation of pixel data by using the data stored in the memory device 53.

For example, the signals of the sensor cells 13 are read when no light illuminates them and are stored in the memory device 53. The signals represent intrinsic noises of the sensor cells 13 ascribable to characteristics of the photodetectors or the photosensing circuit. When a partial image is read, the signals of the sensor cells are decreased by the counterparts stored in the memory device 53. Then, an image without the intrinsic noises is output finally.

Figure 19:
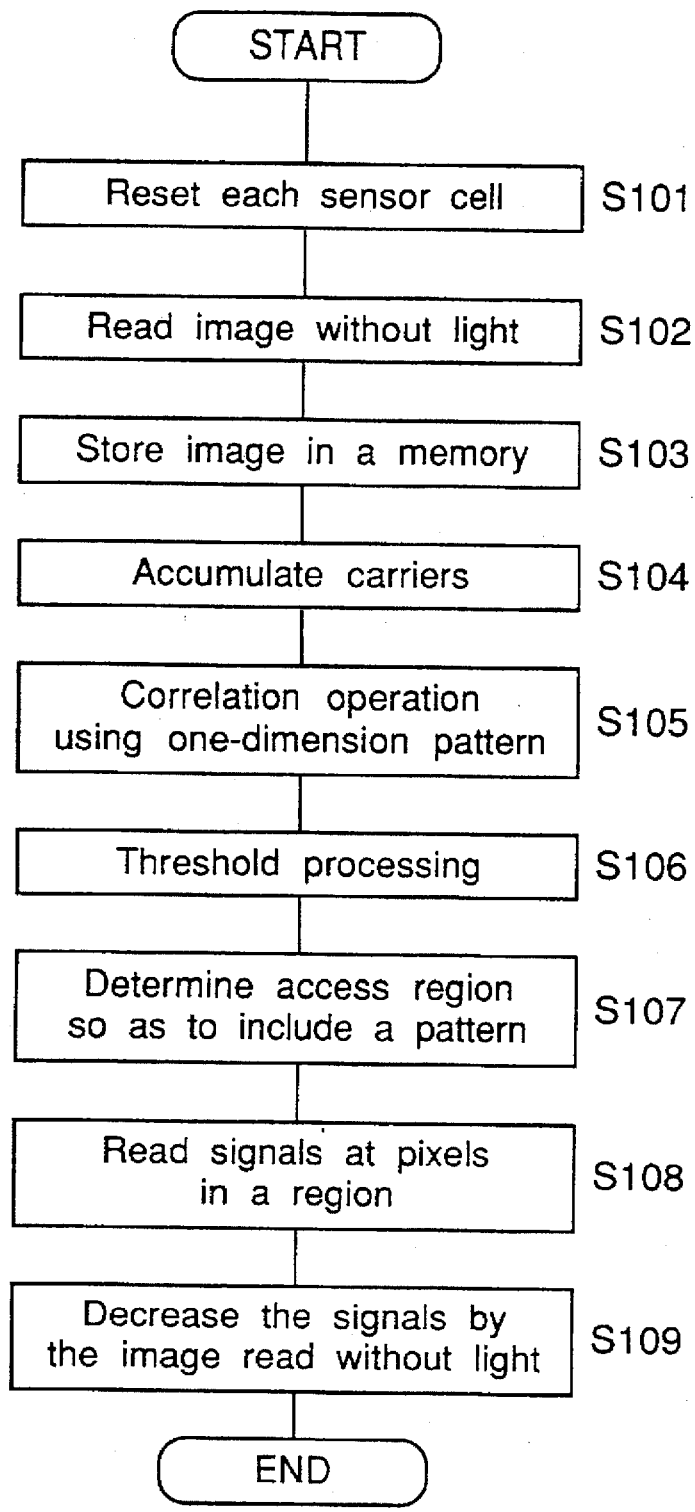
FIG. 19 is a flowchart of image sensing.

FIG. 19 shows a flow of this image detection processing. This flow is different from the flow shown in FIG. 11 on steps S102–S103 and S109. That is, charges in all the sensor cells 13 in the array 1 are reset by the control signal $V_C$ from the third scanner 4 (step S101). Next, carriers as intrinsic noises generated in the sensor cells without illumination are read (step S102), and the read data are stored in the memory device 53 (step S103). Then, a light or an image illuminates the array, and carriers are accumulated in the sensor cells 13 (step S104). Then, the control signals $V_H$ and $V_L$ is generated in correspondence to a pattern to be detected, and pattern matching or correlation operation is performed by using the one-dimensional pattern (step S105). Then, the result of the pattern matching is sent through the multiplexer 5, the amplifiers 7 and the A/D converters 8 to the threshold processor 9 to detect a pattern (step S106). Next, the region determination circuit 10 determines a read region (or access region) so as to include the pattern to be detected by taking the detected pattern into account (step S107). Then, the first scanner 2 sends the control signal in correspondence to the read region along line direction according to the determined region, while the random scanner in the multiplexer 3 sends the control signal along column direction. Thus, pixel signals of a partial image in the read region are read through the read multiplexer 11 (step S108). Finally, the read data are subtracted by the operation circuit 54 by the counterparts stored in the memory device 53 to remove intrinsic noises.

In a different example, the operation circuit 45 operates averaging. First, a region to be accessed for pattern matching is determined, and the pixel signals of the region are stored in the memory device 53. Then, the same region is read by a prescribed times, and a plurality of the data are stored in different regions in the memory device 53. Next, the stored image data are averaged by the operation circuit 45. The averaging may be performed by adding the data and by dividing the sum with the number of image data.

Figure 20:
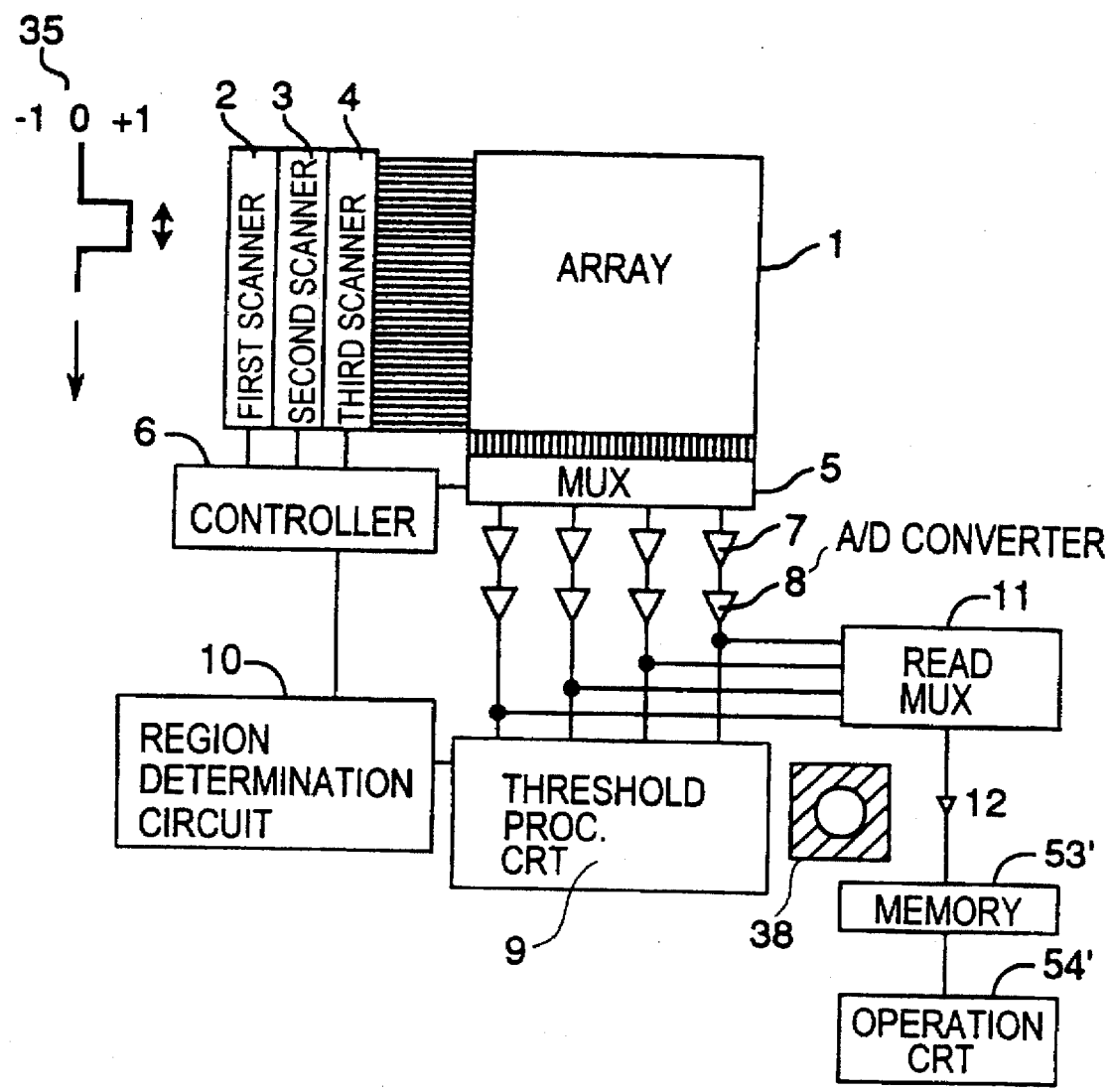
FIG. 20 is a block diagram of an image sensing apparatus.

FIG. 20 shows a modified example of image sensing apparatus of FIG. 18 for detecting a light spot illuminating the array 1. A memory device 53' and an operation circuit 54' are connected to the read multiplexer 11 in order to calculate the center of gravity. The memory device 53' stores image data when a light spot illuminates the array in the background of black, and the operation circuit 54' determines a position of center of gravity of the light spot.

Next, the operation of image detection is explained. First, correlation is operated by using a control pattern 35 displayed at the left side in FIG. 20, and the output signal shows strong correlation signals at positions of the spot. The position of the spot can be determined by the threshold processor 9 with threshold processing. Next, an access region is determined by taking the size of the spot into account. Then, pixel signals in a partial region including the spot are read by using randomness of the scanner 3 and the multiplexer 5 as explained above and stored in the memory device 53'. Finally, digital calculations of Eqs. (4) and (5) are carried out on the stored image data (pixel signal $W_{ij}$, X coordinate $X_{ij}$ and Y coordinate $Y_{ij}$) by the operation circuit 54'.

$$X_c = (\Sigma W_{ij} X_{ij}) / \Sigma W_{ij}, \quad (4)$$

and $$Y_c = (\Sigma W_{ij} Y_{ij}) / \Sigma W_{ij}, \quad (5)$$

wherein $X_c$ and $Y_c$ represent peak coordinates or coordinates at the center of gravity of the spot. The resolutions thereof become higher than that of the sensor cells 13 in the array 1.

The above-mentioned example is explained on a distinct image of a spot in black background. However, if a background exists, a similar operation can be realized by selecting a control pattern so as to have high correlation only at the spot or by selecting an appropriate threshold value on threshold processing.

The operation circuit 54' determines the peak coordinates of the spot by calculating the center of gravity. However, the peak coordinates can be determined by fitting the data to an profile function of the spot which is assumed beforehand. In this case, the operation circuit 54' is replaced with a general digital operation circuit.

Figure 21:
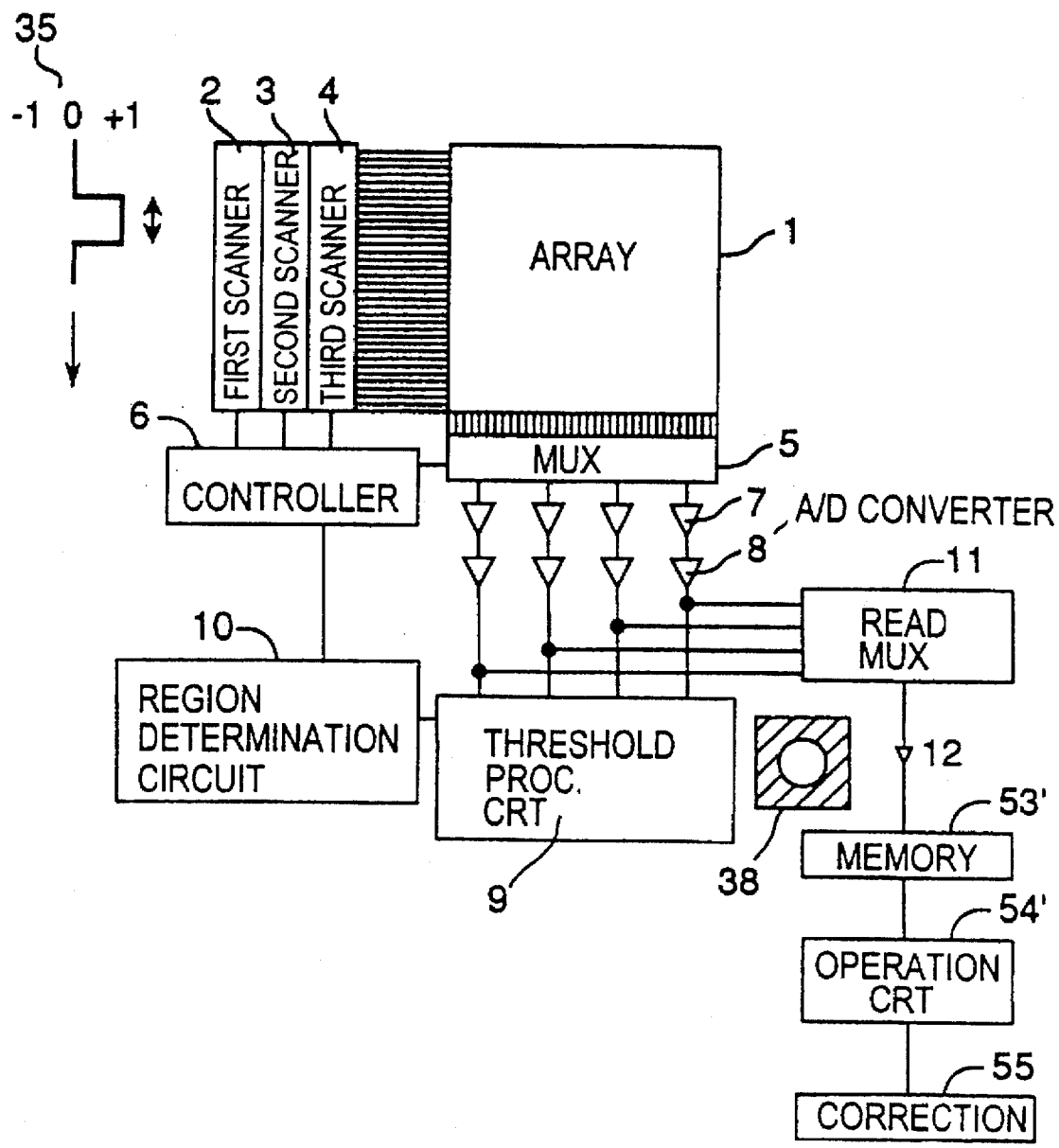
FIG. 21 is a block diagram of another image sensing apparatus.

FIG. 21 shows a modified example of image sensing apparatus which comprises the apparatus shown in FIG. 20 and a correction means 55 for optical system connected to the operation circuit 54'. When a spot position in a wide plane is detected with a lens, the coordinate system of the plane is deformed on the sensor cell array 1 due to distortion of the optical system. The center of gravity is a position in the sensor cell array 1. Therefore, if the center of gravity is corrected on the distortion, the coordinates in the plane can be obtained more precisely. Correction may be performed with a correction formula, or with a table in correspondence of the coordinates. Thus, an image even in a wide area can be detected with a high precision.

Figure 22:
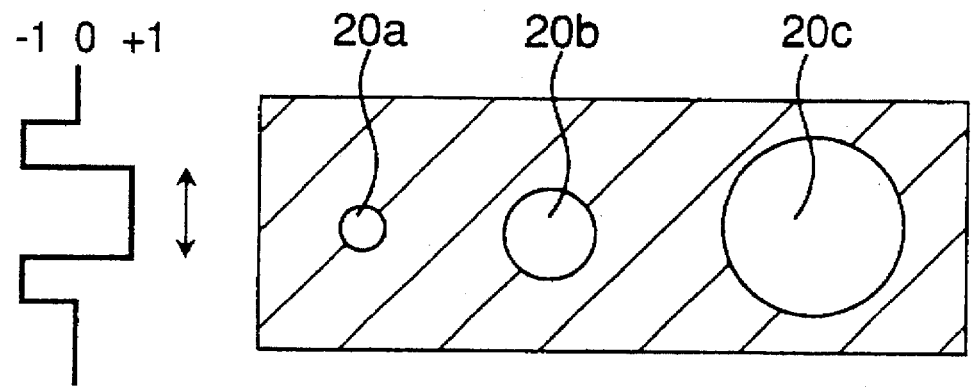
FIG. 22 is a diagram of control pattern of image sensing.

FIG. 22 shows another example of control pattern used for correlation in the sensor cell array 1 having a structure shown in FIG. 12. Three spots 20a, 20b and 20c of three different sizes in a black background are illuminated onto the sensor cell array 1, and they are detected as input images (incident light $W_{ij}$), and a control pattern 35 for detecting the spot 20b having the middle size is set as shown at the left side in FIG. 22, as follows: Both sides of a positive value are set to have negative ones. A width of the positive value (or a double arrow displayed in FIG. 22) is set to have a width of the spot 20b having the middle size. When the three spots of various sizes are input for the control pattern, the output signals of correlation becomes middle, large and small for the spots 20a, 20b and 20c having the small, middle and large sizes, respectively. Thus, the spot 20b having the middle size can be detected to have the highest correlation. Similarly, by setting an appropriate threshold value for threshold processing, a spot having a prescribed size can be detected. If such a spot is detected, its partial image is read, and the peak coordinates thereof can be calculated by using the center of gravity thereof or the like. Similarly, if the threshold value is set to have a relatively small value, spots having sizes smaller than a prescribed size can be detected.

Figure 23:
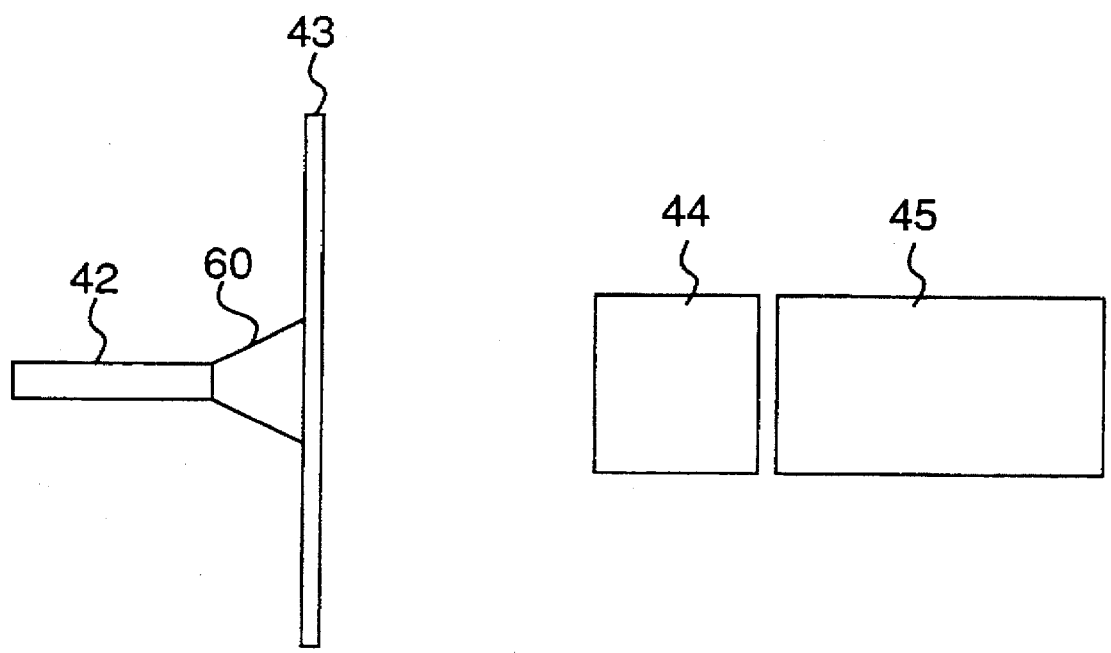
FIG. 23 is a block diagram of an image sensing apparatus.

FIG. 23 shows an example of a structure of an image sensing apparatus. A dispersing light 60 emitted from a light source 42 forms an image on a screen 43, and it focuses an image through a lens 44 onto the sensor cell array (not shown) in the image sensing apparatus 45. The apparatus 45 comprises components from the sensor cell array as a photodetection section to an output device.

Next, the operation of the image sensing apparatus is explained. A dispersion light 60 from the light source 42 forms a spot on the screen 43. If the light source 42 moves towards the screen 43, the spot becomes smaller, while if it moves away, the spot becomes larger. The spot on the screen 43 is illuminated by the lens 44 onto the sensor cell array in the image sensing apparatus 45. Similarly to the pattern shown at the left side in FIG. 22, the apparatus 45 can detect a spot having a prescribed size by using a control pattern if the positive width (a width shown with a double arrow) of the control pattern is set to have a value in correspondence to a size of the spot when the light source moves towards the screen 43, the spot can be detected only when the light source 42 moves towards the screen 43, and the coordinates of the spot can be detected.

In a modified example where the image sensing apparatus shown in FIG. 20 is used as the image sensing apparatus 45 shown in FIG. 23, the operation circuit 54' connected to the memory device 53 comprises an adder. The image stored in the memory device 53 includes only a spot. Therefore, by summing the pixel signals, a total power of the spot can be obtained. Then, if an intensity modulation mechanism is added to the light which forms a spot, the modulation signals can be detected. That is, the intensity change of the total power is sent to the sensor cell array in time series, and information can be transmitted by intensity change.

In an embodiment of the invention, a movement of a spot is detected by using the apparatus shown in FIG. 18. In this example, the memory device 53 stores pixel data of a partial region with coordinates thereof, and the operation circuit 54 compares the coordinates with the counterpart in a previous time when the total quantity of light of the spot is changed. A change in a different region can be interpreted due to inhomogeneity of optical input system such as a lens or due to movement of an object. If the change is ascribed to the inhomogeneity of the optical input system, a change only in the same region is detected as signals from the light source.

Figure 24:
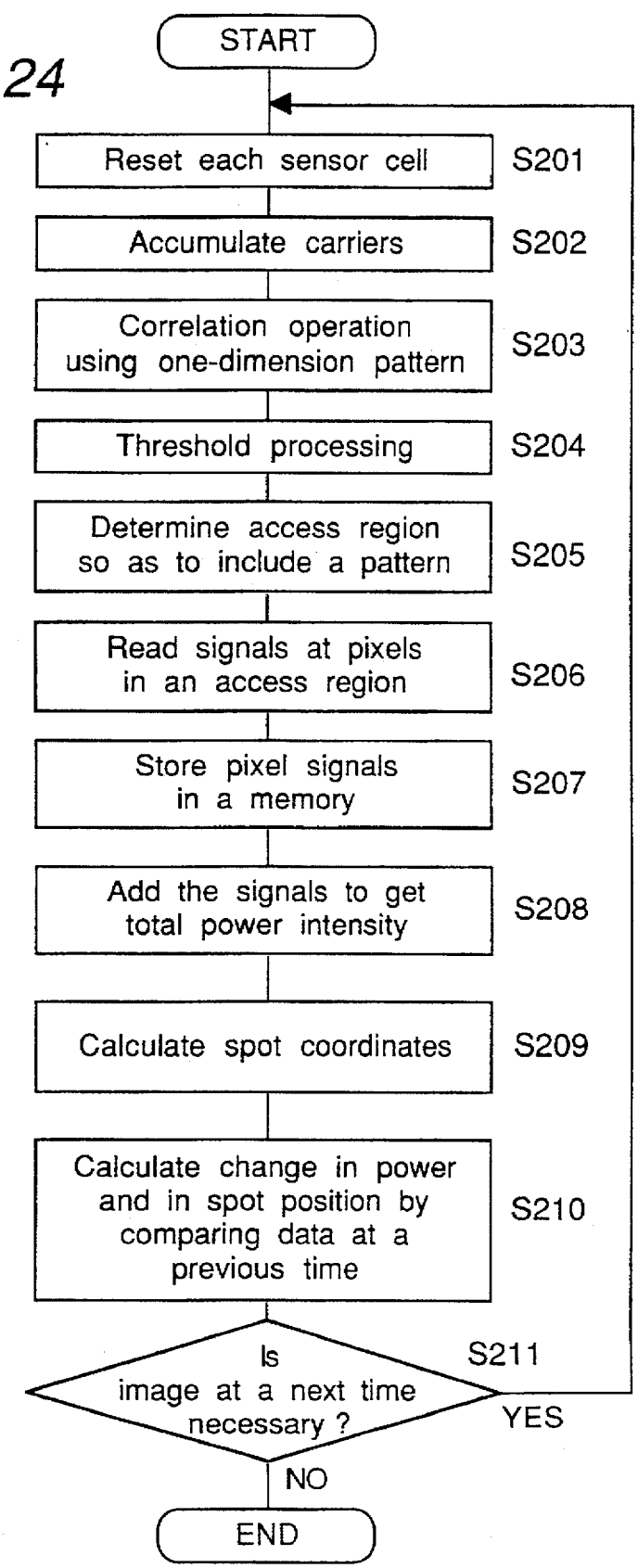
FIG. 24 is a flowchart of image sensing.

FIG. 24 shows a flow of the image detection. The flow includes steps S201–S206 which are the same as steps S1–S6 shown in FIG. 11. After step S206, the pixel signals of the region to be detected are stored in the memory device 53 (step S207), and all the pixel signals are added by the operation circuit 54 to obtain a total power intensity (step S208). Then, the coordinate positions of the spot or of the read region are calculated by the operation circuit 54 and stored in the memory device 53 (step S209). Next, by comparing the coordinate positions with the data at the previous time, changes in power and in spot position are calculated by the operation circuit 54 (step S210). That is, when the total power of the spot changes, the coordinates of the spot are compared with those stored in the memory device 53. A change in different region is decided that the spot input system (such as the lens) has inhomogeneity or the image is moving. If the change in a different region is ascribed to inhomogeneity of the spot input system (such as the lens), only the change in the same region is detected as signals formed by the light source. If the image is decided to be needed at a next time (YES at step S211), the flow returns to step S201, otherwise the flow completes.

Figure 25:
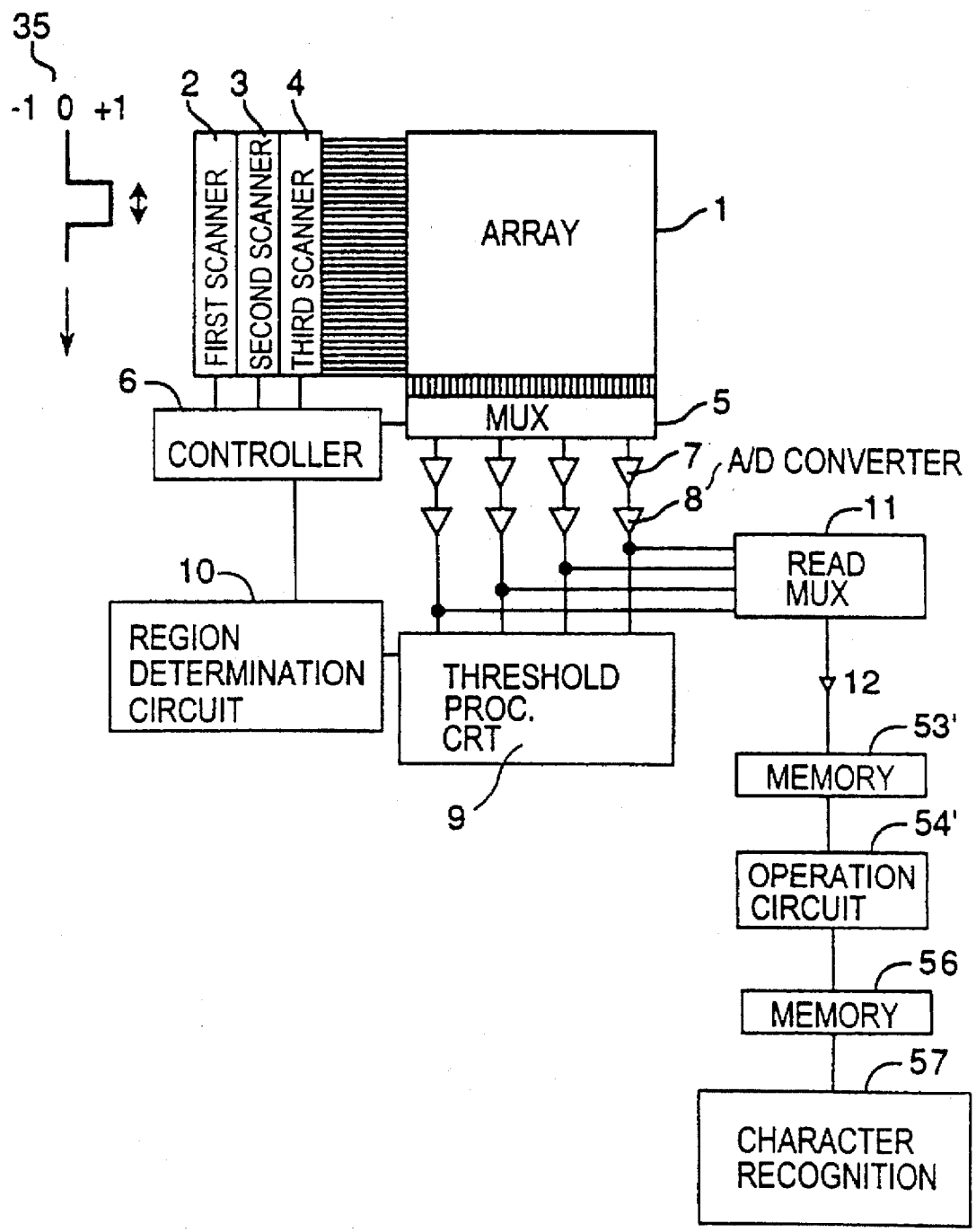
FIG. 25 is a block diagram of an image sensing apparatus.

FIG. 25 shows a modified example of an image sensing apparatus having character recognition function where a character written with a spot is recognized. The apparatus comprises a memory device 56 and a character recognition means 57 besides the device shown in FIG. 20. The memory device 56 stores a partial image including a light spot, and the operation circuit 54' calculates the center of gravity of the light spot at each time. The coordinates of the spot detected at each time are stored in the memory device 56. Then, the character recognition means 57 performs character recognition according to the data stored in the memory 56. The character recognition means 57 may be a hardware circuit or a software program used by a computer. A neural network having learning function may be used for character recognition.

Figure 26:
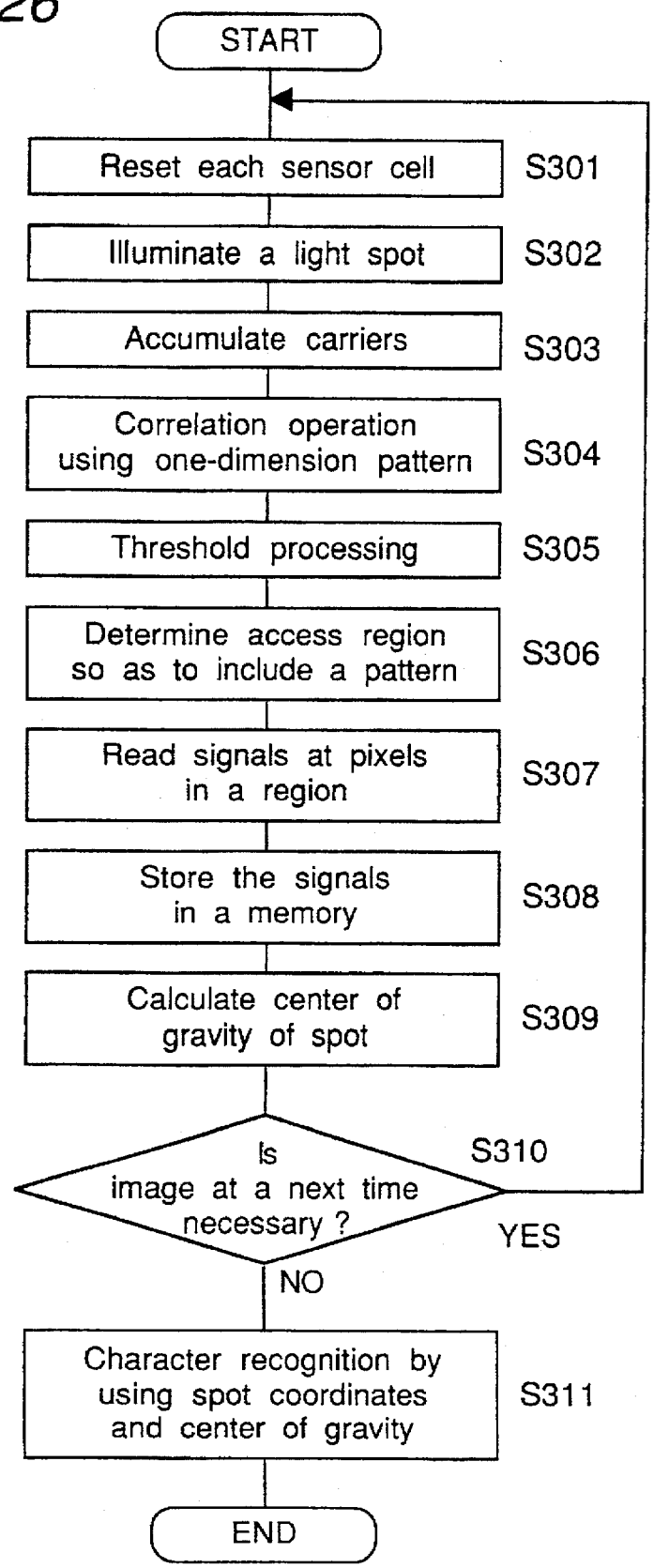
FIG. 26 is a flowchart of image sensing.

FIG. 26 shows a flow of character recognition. In the flow, steps S301–S307 are similar to steps S1–S6 in FIG. 11, except step S302 which is included in step S2 in the flow shown in FIG. 11 and is shown explicitly in the flow in FIG. 26. That is, after charges in all the sensor cells in the array 1 are reset (step S301), a light spot or an image is illuminated onto the array 1 (step S302), and carriers as image signals are accumulated in the sensor cells (step S303). Then, a region including the spot is detected by using pattern matching (step S304), and a read region (or access region) is determined by taking the detected region into account (steps S305 and S306). Then, pixel signals of a partial image in the read region are read through the read multiplexer 11 (step S307), and the pixel signals are stored in the memory device 40 (step S308). Next, the center of gravity is calculated on the partial image including the spot by the operation circuit 54', and the result is stored in the memory device 56 (step S309). Thus, the peak coordinates of the spot can be detected with a high resolution. The flow returns to step S301 to repeat the processings to trace the moving spot in the plane (YES at step S310). When a character is written, the spot is moving to write the character. Then, the trace of the character (coordinates of the spot) and the writing sequence are detected. The trace is used to recognize the character by the character recognition means 57 by using the writing sequence (step S311).

In the embodiment, the plane may be a dispersion screen, a dispersion light source may be used for generating a light spot, and a control pattern shown at the left side in FIG. 22 may be used. In this case, the light spot is detected only when the dispersion light source becomes near the screen. Then, a character is written with a plurality of strokes, the separation between the strokes can be realized by moving off the spot from the screen. Further, image detection in an image detection device which is also used as an image display device. Further, image detection with a display device using a large screen can be realized.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An image sensing apparatus comprising:
   an array of two-dimensional matrix of photosensitive devices, each photosensitive device comprising a photosensor accumulating carriers when exposed to a light, a signal generator comprising control terminals and an output terminal and generating a pixel signal with a polarity in correspondence to the amount of the carriers in the photosensor when first control signals including the polarity are received at the control terminals, the pixel signal being output through the output terminal, and a reset circuit comprising a reset terminal and resetting the photosensor in an initial state with no carriers when a reset signal is received at the reset terminal, the control terminals of the photosensors arranged along each line in said array being connected commonly, the output terminals of the photosensors arranged along each column in said array being connected commonly;
   a first signal supplier connected to the control terminals in said array and supplying the first control signals to lines in said array;
   a second signal supplier connected to the reset terminals in said array and supplying the reset signals to the reset terminals;
   an output circuit connected to the control terminals of said array, said output circuit outputting the pixel signals for columns designated by a second control signal;
   a controller generating a first signal to said first signal supplier to generate the first control signals, the second control signal to said output circuit, and a second signal to said second signal supplier to generate the reset signal; and
   a determination means for receiving the pixel signals of the photosensors of said array from said output circuit when said controller supplies the first and second control signals to output the pixel signals of all the photosensors, for determining a partial region in said array including a region exposed by the light according to the pixel signals received, and for outputting data on the partial region to said controller;
   wherein said controller generates the first and second control signals according to a data on the partial region when the data is received from said determination means.

2. The apparatus according to claim 1, wherein said first signal supplier generates the first control signals for the lines in said array sequentially in time series.

3. The apparatus according to claim 2, wherein the control terminals of the signal generator in each photosensitive device in said array comprising a first terminal and a second terminal and the signal generator generates the pixel signal with a positive polarity when a control signal is supplied to the first terminal and the pixel signal with a negative polarity when a control signal is supplied to the second terminal, said first signal supplier comprising:
   a first scanner supplying the control signal to the first terminals for each lines in said array according to the first signal received from said controller; and
   a second scanner supplying the control signal to the second terminals for the photosensitive devices in each line in said array according to the first signal received from said controller.

4. The apparatus according to claim 3, further comprising a third scanner supplying control signals for resetting the photosensitive devices to the reset terminals.

5. The apparatus according to claim 3, wherein said first scanner comprises a random scanner which sends the control signal to prescribed range of lines of the two-dimensional matrix of photosensitive devices.

6. The apparatus according to claim 2, wherein said first signal supplier comprises a logical circuit to generate the first control signals.

7. The apparatus according to claim 1, wherein said output circuit comprises a random scanner which outputs signals from the photosensitive devices in a prescribed range of columns of the two-dimensional matrix of photosensitive devices.

8. The apparatus according to claim 1, wherein said output circuit comprises:
- a multiplexer for outputting the pixel signal received from said array;
- an amplifier amplifying the pixel signal received from said multiplexer; and
- an analog-to-digital converter for converting the pixel signal received from said amplifier to a digital value.

9. The apparatus according to claim 8, wherein said multiplexer comprises a random scanner which outputs signals from the photosensitive devices in a prescribed range of columns of the two-dimensional matrix of photosensitive devices.

10. The apparatus according to claim 8, said output circuit further comprising a threshold circuit for comparing the digital value received from said analog-to-digital converter with a threshold level, to output a result of comparison to said determination circuit as the pixel signal for determining the partial region.

11. The apparatus according to claim 8, said output circuit further comprising a maximum circuit for detecting a maximum value received from said analog-to-digital converter, to output the maximum value to said determination circuit as the pixel signal for determining the partial region.

12. The apparatus according to claim 8, said output circuit further comprising a minimum circuit for detecting a minimum value received from said analog-to-digital converter, to output the minimum value to said determination circuit as the pixel signal for determining the partial region.

13. The apparatus according to claim 1, further comprising a device for setting a time for accumulating carriers in said photosensitive devices.

14. A method of image sensing by using an image sensing apparatus including an array of two-dimensional matrix of photosensitive devices, each photosensitive device comprising a photosensor accumulating carriers when exposed to a light, a signal generator comprising control terminals and an output terminal and generating a pixel signal with a polarity in correspondence to the amount of the carriers in the photosensor when first control signals including the polarity are received at the control terminals, the pixel signal being output through the output terminal, and a reset circuit comprising a reset terminal and resetting the photosensor in an initial state with no carriers when a reset signal is received at the reset terminal, the control terminals of the photosensors arranged along each line in the array being connected commonly, the output terminals of the photosensors arranged along each column in the array being connected commonly; a first signal supplier connected to the control terminals in the array and supplying the first control signals to lines in the array; an output circuit connected to the control terminals of the array, the output circuit outputting the pixel signals for columns designated by a second control signal; and a controller generating a first signal to the first signal supplier to generate the first control signals, the second control signal to the output circuit, and a second signal to the second signal supplier to generate the reset signal; the method comprising the steps of:

(a) resetting charges in said photosensor elements in a initial state;

(b) accumulating charges in said photosensor elements by an illuminated image;

(c) calculating correlation of a matrix having elements of accumulated charges with a vector in correspondence to an object to be detected;

(d) performing a specified operation according to the result of correlation calculation;

(e) determining an access region of the image including the object according to the operation; and (f) outputting pixel signals in the access region.

15. The method according to claim 14, further comprising the steps of:

(g) storing the pixel signals in the access region; and (h) performing operation on the stored pixel signals.

16. The method according to claim 15, wherein the operation in said step (h) is averaging.

17. The method according to claim 15, wherein the operation in said step (h) is calculation of a position of the image.

18. The method according to claim 17, wherein the operation in said step (h) comprises addition to obtain a total intensity of the image.

19. The method according to claim 18, further comprising the step of:

(i) detecting a change in intensity of the image and a change in position of the image by using the calculated position of the image and the total intensity of the image.

20. The method according to claim 17, further comprising the step of:

(i) performing pattern recognition by using a calculated position of the image.

* * * * *